US011356094B2

(12) United States Patent
Chang et al.

(10) Patent No.: US 11,356,094 B2
(45) Date of Patent: Jun. 7, 2022

(54) CIRCUIT ARRANGEMENTS AND METHODS FOR FORMING THE SAME

(71) Applicant: Nanyang Technological University, Singapore (SG)

(72) Inventors: Joseph Sylvester Chang, Singapore (SG); Kwen Siong Chong, Singapore (SG); Ne Kyaw Zwa Lwin, Singapore (SG); Sivaramakrishnan Hariharakrishnan, Singapore (SG)

(73) Assignee: Nanyang Technological University, Singapore (SG)

( * ) Notice: Subject to any disclaimer, the term of this patent is extended or adjusted under 35 U.S.C. 154(b) by 0 days.

(21) Appl. No.: 16/982,408

(22) PCT Filed: Mar. 15, 2019

(86) PCT No.: PCT/SG2019/050142
§ 371 (c)(1),
(2) Date: Sep. 18, 2020

(87) PCT Pub. No.: WO2019/182512
PCT Pub. Date: Sep. 26, 2019

(65) Prior Publication Data
US 2021/0083665 A1 Mar. 18, 2021

(30) Foreign Application Priority Data
Mar. 19, 2018 (SG) .......................... 10201802217V

(51) Int. Cl.
*H03K 19/003* (2006.01)
*H01L 27/02* (2006.01)
*H03K 17/082* (2006.01)

(52) U.S. Cl.
CPC ... *H03K 19/00338* (2013.01); *H01L 27/0251* (2013.01); *H03K 17/0822* (2013.01);
(Continued)

(58) Field of Classification Search
CPC ............... H03K 19/003; H03K 17/082; H03K 19/00338; H03K 17/0822; H01L 27/02; H01L 27/0251
(Continued)

(56) References Cited

U.S. PATENT DOCUMENTS 5,973,512 A 10/1999 Baker
6,278,295 B1 8/2001 Lovett
(Continued)

FOREIGN PATENT DOCUMENTS

CN 103546145 1/2014
EP 1720257 11/2006
(Continued)

OTHER PUBLICATIONS

Barlow, M., et al., "A PFET-access radiation-hardened SRAM for extreme environments," 2008 51st Midwest Symposium on Circuits and Systems, Knoxville, TN, 2008, pp. 418-421.
(Continued)

*Primary Examiner* — Danny Nguyen
(74) *Attorney, Agent, or Firm* — Womble Bond Dickinson (US) LLP

(57) ABSTRACT

A circuit arrangement is provided, having a first circuit configured to receive an input signal, and a second circuit configured to provide an output signal, wherein the first circuit includes a first pull-up network having a first transistor of a first conductivity type and a second transistor of a second conductivity type electrically coupled to each other, and a first pull-down network having a first transistor of the first conductivity type and a second transistor of the second conductivity type electrically coupled to each other, wherein the second circuit includes a second pull-up network having a first transistor of the first conductivity type, and a second pull-down network having a second transistor
(Continued)

of the second conductivity type, wherein the first pull-up network and the second pull-down network are electrically coupled to each other, and wherein the first pull-down network and the second pull-up network are electrically coupled to each other.

20 Claims, 15 Drawing Sheets

(52) U.S. Cl.
CPC ............ *H03K 19/003* (2013.01); *H01L 27/02* (2013.01); *H03K 17/082* (2013.01)

(58) Field of Classification Search
USPC .......................................... 361/56, 91.1, 111
See application file for complete search history.

(56) References Cited

U.S. PATENT DOCUMENTS

| | | | |
|---|---|---|---|
| 7,719,304 | B1 | 5/2010 | Clark et al. |
| 8,217,458 | B2 | 7/2012 | Goike et al. |
| 9,013,219 | B2 | 4/2015 | Cabanas-Holmen et al. |
| 9,136,690 | B1* | 9/2015 | Upadhyaya ......... H01L 27/0266 |
| 2003/0102888 | A1 | 6/2003 | Nagayama |
| 2007/0069305 | A1 | 3/2007 | Kuboyama et al. |
| 2007/0162880 | A1 | 6/2007 | Carlson et al. |
| 2010/0039143 | A1* | 2/2010 | Oh ................. H03K 19/018585 327/108 |
| 2014/0211350 | A1* | 7/2014 | Cox .................... H01L 27/0251 361/56 |

FOREIGN PATENT DOCUMENTS

| | | |
|---|---|---|
| WO | WO 2018/231148 | 12/2018 |
| WO | WO 2019/143302 | 7/2019 |

OTHER PUBLICATIONS

Black, J. D., et al., "HBD layout isolation techniques for multiple node charge collection mitigation," IEEE Transactions on Nuclear Science, 2005, vol. 52(6), pp. 2536-2541.
Cabanas-Holmen, M., et al., "Robust SEU Mitigation of 32 nm Dual Redundant Flip-Flops Through Interleaving and Sensitive Node-Pair Spacing," IEEE Transactions on Nuclear Science, 2013, vol. 60(6), pp. 4374-4380.
Calin, T. et al., "Upset Hardened Memory Design for Submicron CMOS Technology," IEEE Transactions on Nuclear Science, 1996, vol. 43(6), pp. 2874-2878.
Calomarde, A., et al., "A single event transient hardening circuit design technique based on strengthening," 2013 IEEE 56th International Midwest Symposium on Circuits and Systems (MWSCAS), Columbus, OH, 2013, pp. 821-824.
Calomarde, A., et al., "A SET and Noise Fault Tolerant Circuit Design Technique: Application to 7nm FinFET", Microelectronics Reliability, 2014, vol. 54(4), pp. 738-745.
Campitelli, S., et al., "F-DICE: A multiple node upset tolerant flip-flop for highly radioactive environments," IEEE International Symposium on Defect and Fault Tolerance in VLSI and Nanotechnology Systems (DFTS), 2013, pp. 107-111.
Chang, J. S., et al., "Radiation-hardened library cell template and its total ionizing dose (TID) delay characterization in 65nm CMOS process," 2014 IEEE 57th International Midwest Symposium on Circuits and Systems (MWSCAS), College Station, TX, 2014, pp. 821-824.
Chen, J., et al., "Radiation Hardened by Design Techniques to Reduce Single Event Transient Pulse Width Based on the Physical Mechanism," Microelectonics Reliability, 2012, vol. 52, No. 6, pp. 1227-1232.
Diestelhorst, R. M., et al., "Junction Isolation Single Event Radiation Hardening of a 200 GHZ SiGe:C HBT Technology Without Deep Trench Isolation," IEEE Transactions. Nuclear Science, 2009, vol. 56(6), pp. 3402-3407.
Dodd, P. E., et al., "Current and Future Challenges in Radiation Effects on CMOS Electronics," IEEE Transactions on Nuclear Science, 2010, vol. 57(4), pp. 1747-1763.
Garg, R., et al., "A novel, highly SEU tolerant digital circuit design approach," 2008 IEEE International Conference on Computer Design, Lake Tahoe, CA, 2008, pp. 14-20.
Hoang, T., et al., "A Radiation Hardened 16-Mb SRAM for Space Applications," 2007 IEEE Aerospace Conference, Big Sky, MT, 2007, pp. 1-6.
Intersil, "Radiation Hardened Octal Transparent Latch, Three-State," HCS573MS datasheet, Sep. 1995.
Jahinuzzaman, S. M., et al., "Design and Analysis of A 5.3-pJ 64-kb Gated Ground SRAM with Multiword ECC," IEEE Journal of Solid-State Circuits, 2009, pp. 2543-2553.
Jang, W. "Soft-error Tolerant Quasi Delay-Insensitive Circuits," PhD Thesis, 2008.
Jiang, J., et al., "A 5.6 ppm/° C. Temperature Coefficient, 87-dB PSRR, Sub-1-V Voltage Reference in 65-nm CMOS Exploiting the Zero-Temperature-Coefficient Point," IEEE Journal of Solid-State Circuits, 2017, vol. 52(3), pp. 623-633.
Jiang, J., et al., "Total Ionizing Dose (TID) effects on finger transistors in a 65nm CMOS process," 2016 IEEE International Symposium on Circuits and Systems (ISCAS), Montreal, QC, 2016, pp. 5-8.
Knudsen, J. E., et al., "An Area and Power Efficient Radiation Hardened by Design Flip-Flop," IEEE Trans. Nuclear Science, v. 53, No. 6, 2006, pp. 3392-3399.
Lacoe, R. C., "Improving Integrated Circuit Performance Through the Application of Hardness-by-Design Methodology," IEEE Transactions on Nuclear Science, 2008, vol. 55(4), pp. 1903-1925.
Lacoe, R. C., et al., "Application of hardness-by-design methodology to radiation-tolerant ASIC technologies," IEEE Transactions on Nuclear Science, 2000, vol. 47(6), pp. 2334-2341.
Lee, H. H. K., et al., "Design Framework for Soft-Error-Resilient Sequential Cells," IEEE Transactions on Nuclear Science, 2011, vol. 58, No. 6, pp. 3026-3032.
Lin, T., et al., "Experimental investigation into radiation-hardening-by-design (RHBD) flip-flop designs in a 65nm CMOS process," IEEE International Symposium on Circuits and Systems (ISCAS), 2016, pp. 966-969.
Narasimham, B., et al., "A Hysteresis-Based D-Flip-Flop Design in 28 nm CMOS for Improved SER Hardness at Low Performance Overhead," IEEE Transactions on Nuclear Science, 2012, vol. 59(6), pp. 2847-2851.
Naseer, R., et al., "DF-DICE: a scalable solution for soft error tolerant circuit design," IEEE International Symposium on Circuits and Systems (ISCAS), 2006, pp. 3890-3893.
Rodbell, K., et al., "32 and 45 nm Radiation-Hardened-By-Design (RHBD) SOI Latches," IEEE Trans. Nuclear Science, 2011, vol. 58(6).
Yamamoto, R., et al., "An Area-Efficient 65nm Radiation-Hard Dual-Modular Flip-flop to avoid multiple cell upsets," IEEE Transactions. Nuclear Science, 2011, vol. 58(6), pp. 3053-3059.
Zhou, Q., et al., "Gate Sizing to Radiation Harden Combinational Logic," IEEE Trans. Comp.-Aided Design of Integrated Circuits and Systems, vol. 25, No. 1, pp. 155-166, 2006.
European Search Report for Application No. 19771480.1, dated Nov. 18, 2021 (9 pages).

* cited by examiner

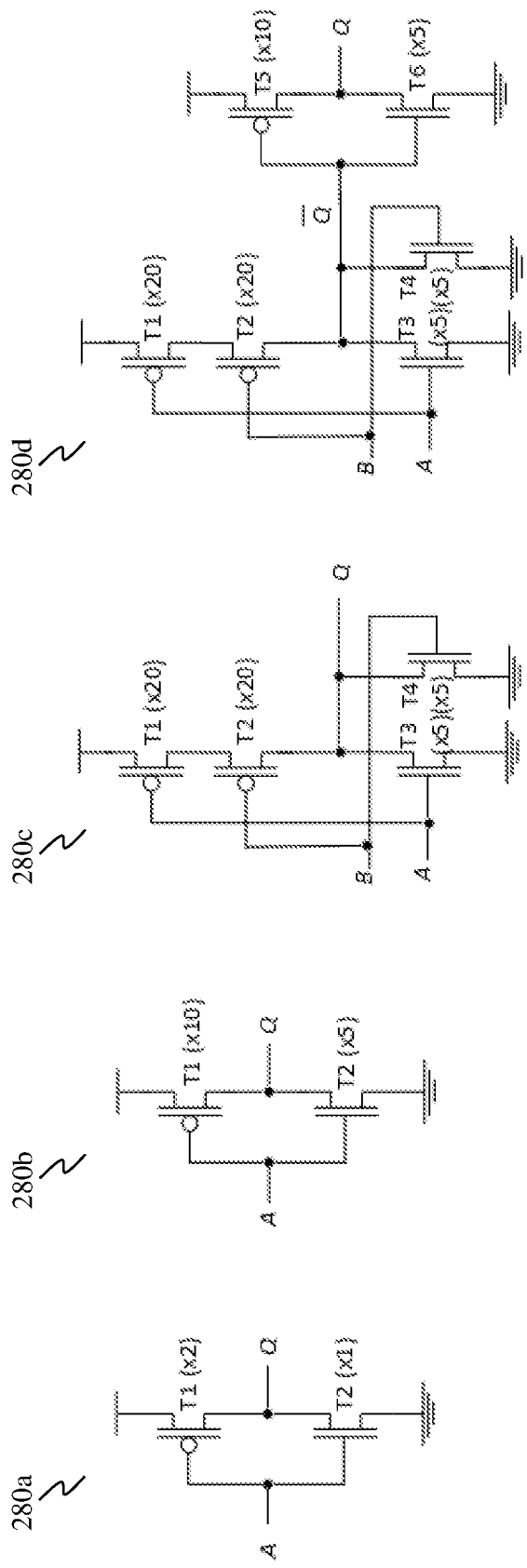

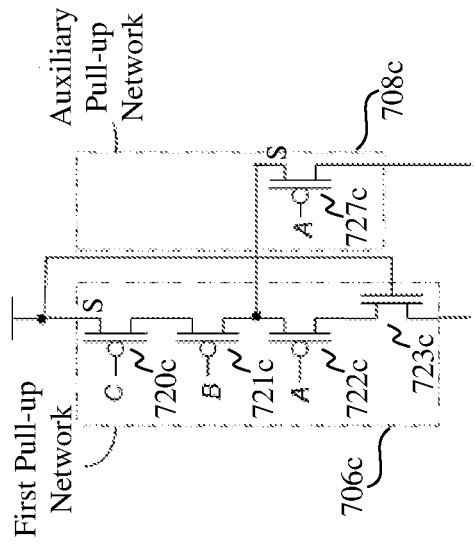
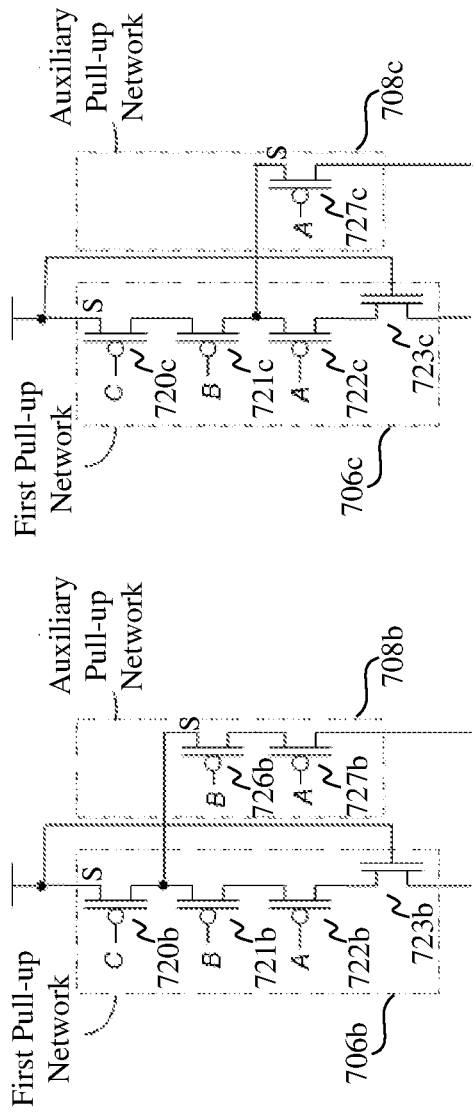
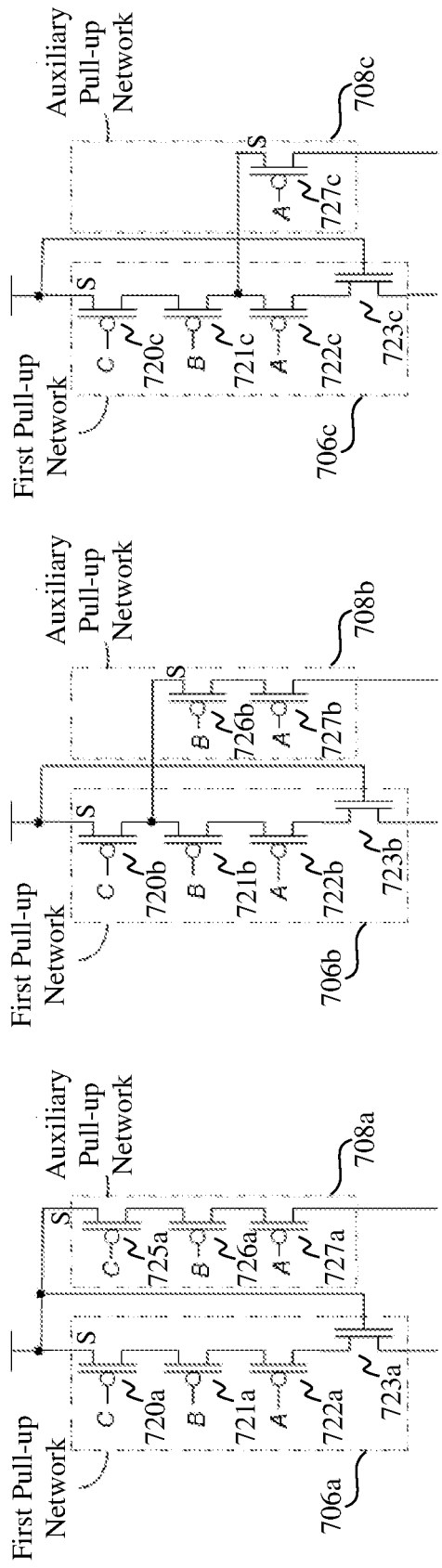
FIG. 7A
FIG. 7B
FIG. 7C
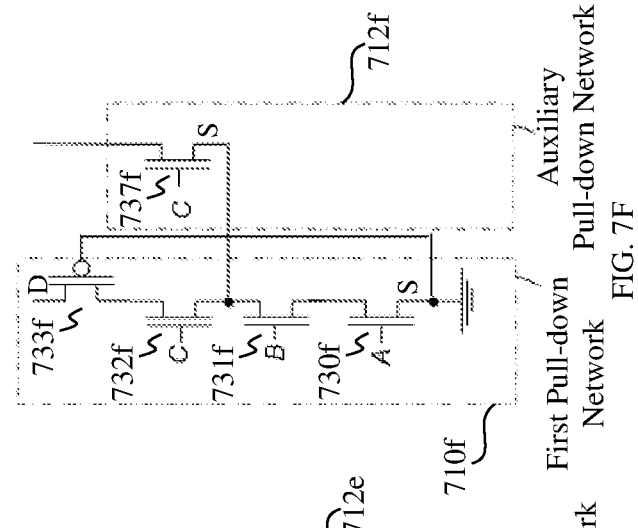
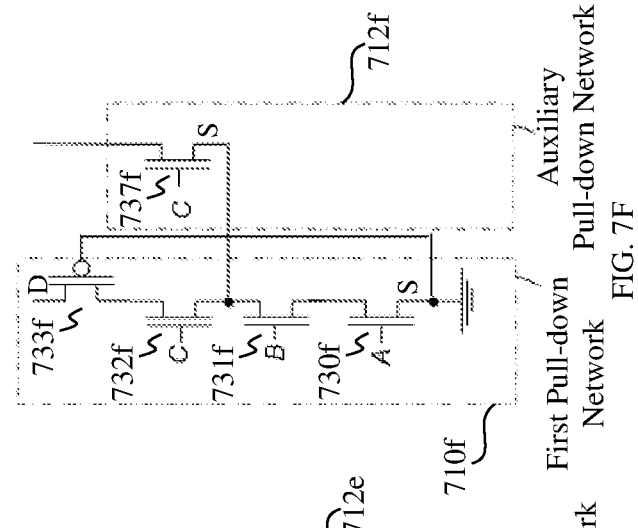
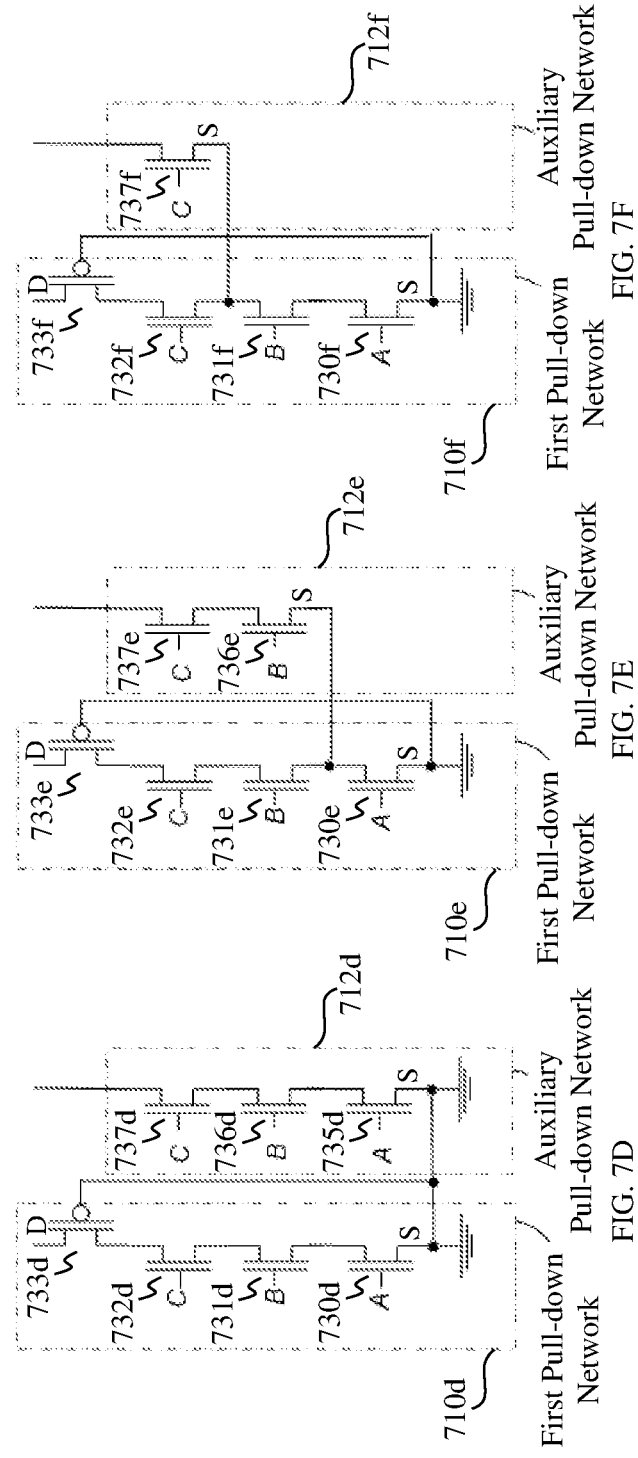
FIG. 7D
FIG. 7E
FIG. 7F

CIRCUIT ARRANGEMENTS AND METHODS FOR FORMING THE SAME

CROSS-REFERENCE TO RELATED APPLICATIONS

This application is a national stage filing under 35 U.S.C. § 371 of PCT/SG2019/050142, filed Mar. 15, 2019, which International Application was published by the International Bureau in English on Sep. 26, 2019, as WO 2019/182512, which claims the benefit of priority of Singapore patent application No. 10201802217V, filed 19 Mar. 2018, which applications are hereby incorporated by reference in their entirety in this application.

TECHNICAL FIELD

Various embodiments relate to circuit arrangements and methods for forming circuit arrangements.

BACKGROUND

In extra-terrestrial space-and-satellite (S&S) applications, the robustness of integrated circuits (ICs) is one of the most important design considerations. This is because ICs embodied in electronics systems for S&S applications are subjected to various possible radiation effects which potentially jeopardize the functionality of ICs and at worst, cause permanent and irreparable damage to the ICs. The possible radiation effects include single-event-effects (SEEs) where errors are induced when energized particles strike the ICs. One of the SEEs is single-event-transient (SET) where a single event (e.g., an energized particle) striking at a transistor node induces electrical charges that create a transient pulse on the transistor node. The transient pulse could be detrimental to the ICs. For example, in digital circuits, the transient pulse can result in a single-event-upset (SEU) by flipping the logic state in sequential logic, causing an error. The occurrence of SEEs in ICs is expected to be high when advanced nano-scaled fabrication processes (e.g., <90 nm feature size) are used and/or under severe irradiation environments. Hence, it is highly desirable to mitigate SETs (and hence SEUs) to enhance the overall robustness of ICs for S&S applications.

Similarly, for terrestrial high-reliability (high-rel) applications such as automotive (e.g., level 5 autonomous vehicles), the same robustness consideration also applies because of the presence of heavy particles in the environment including alpha-included particles in the packaging material (emitted from the residual radioactive elements), possibly causing undesirable malfunctions.

To mitigate SEEs, ICs can be realised to be radiation-hardened by means of dedicated IC fabrication processes, design techniques, or a combination thereof. The dedicated IC fabrication processes employed for such applications are exotic in the sense that these processes are not readily available and whose costs are typically prohibitive. On the other hand, the design techniques for radiation-hardening, also known as RHBD (Radiation-Hardened-By-Design), are increasingly popular because RHBD techniques can be incorporated into current state-of-the-art commercially-available fabrication processes.

The basic mechanism explaining how an SET is created is first briefly described below.

FIG. 1A shows a schematic diagram of an inverter 180a having a PMOS (p-type metal-oxide-semiconductor) transistor 182a and an NMOS (n-type metal-oxide-semiconductor) transistor 184a, where the PMOS transistor 182a is Off, and the drain (D) of the PMOS transistor 182a is struck by a radiation particle 186a. FIG. 1B depicts the cross-sectional view of the inverter 180a where the radiation particle 186a strikes at the p+ region 188a (drain (D) of the PMOS 182a). During the strike, electron-hole pairs are induced but the electrons are quickly absorbed in the already hole-rich p+ region 188a, leaving the induced holes in the p+ region 188a. As a result, as depicted in FIG. 1C, the output Q will switch from logic '0' to logic '1' temporarily, creating a positive SET pulse 192a. The SET pulse 192a will gradually disappear after the induced holes are finally absorbed. The SET pulse 192a is typically very short, about 100 ps to 250 ps. Further, although the drains (D) (p+ region 188a and n+ region 190a) of the NMOS and PMOS transistors 182a, 184a are connected together, if the irradiation particle 186a only strikes at the NMOS transistor 184a which is On, it is logically inconsequential as a very small negative pulse will only be created, where the negative pulse will enhance the logic state of '0'.

FIG. 1D similarly depicts a schematic diagram of an inverter 180d having a PMOS transistor 182d and an NMOS transistor 184d, where the NMOS transistor 184d is Off, and the drain (D) of the NMOS transistor 184d is struck by a radiation particle 186d. FIG. 1E depicts the cross-sectional view of the inverter 180d where the radiation particle 186d strikes at the n+ region 190d (drain (D) of the NMOS 184d. During the strike, electron-hole pairs are induced but the holes are quickly absorbed in the already electron-rich n+ region 190d, leaving the induced electrons in the n+ region 190d. As a result, as depicted in FIG. 1F, the output Q will switch from logic '1' to logic '0' temporarily, creating a negative SET pulse 192d. The SET pulse 192d will gradually disappear after the induced electrons are finally absorbed. The SET pulse 192d is also typically very short, about 100 ps to 250 ps. Further, although the drains (D) (p+ region 188d and n+ region 190d) of the NMOS and PMOS transistors 182d, 184d are connected together, if the radiation particle 186d only strikes at the PMOS transistor 182d which is On, it is logically inconsequential as a very small positive pulse will only be created, where the positive pulse will enhance the logic state of '1'.

It is well established that digital circuits are vulnerable to SEEs under radiation environments, unless the transistors therein are intentionally up-sized significantly, e.g., by 5×-100× larger than the default sizing (at earth/terrestrial conditions). However, the transistor up-sizing practice is generally not adopted because the transistors therein would be very large, costing too much area and power overheads, and, hence, impractical. As a result, other RHBD practices span from layout- to circuit- to architecture-levels. These RHBD techniques are briefly summarized as follows.

At the layout-level, the simplistic way is to increase the critical charges on the transistor nodes by adding more capacitive loads, e.g., by increasing the diffusion areas or by adding capacitance. Other techniques include careful layout techniques such as well separation. These layout-level techniques, however, are ineffective especially where irradiation particles carry higher energy per unit distance (e.g., in high radiation environments such as in geosynchronous earth orbit (GEOs) or the South Atlantic Anomaly (SAA)). At the circuit-level, the common RHBD practices include pulse filtering technique, increased RC (resistance-capacitance) delay on the critical nodes, feedback techniques, antenna cell insertion, etc. These circuit-level RHBD practices help to mitigate SETs/SEUs at the expense of slower speed, higher power dissipation and larger area overheads. At the architecture-level, the common RHBD techniques include double redundancy, Triple Modular Redundancy, and error detection and error correction techniques. As expected, these architecture-level RHBD techniques tradeoff speed/power/area for SET/SEU robustness.

The primary reason why the standalone transistor upsizing practice is ineffective is because stacking (series) transistor paths make their transistor sizing really large. As a non-limiting example, FIG. 2A illustrates a standard (earth-based) inverter 280a with a PMOS transistor T1 and an NMOS transistor T2 having a sizing of ×2 and ×1 respectively. For S&S and hi-rel conditions, the sizing of transistors may need to be increased, for example, to 5 times larger, e.g., to ×10 for a PMOS transistor T1 and ×5 for an NMOS transistor T2 as shown in FIG. 2B illustrating RHBD up-sizing for an RHBD inverter 280b. For a NOR gate, as illustrated in FIG. 2C for RHBD up-sizing for an RHBD NOR gate 280c, where 2 stacking PMOS transistors T1, T2 are needed, in order to achieve the same effective sizing as the benchmark RHBD inverter, each of the PMOS transistors T1, T2 need to have a sizing of ×20. The transistor up-sizing would be even larger for higher stacking transistors (e.g. ≥3 stacking transistors), hence excessively expensive in terms of area and power dissipation. For a multi-level gate such as an OR gate (i.e., NOR gate followed by an inverter), referring to FIG. 2D illustrating RHBD up-sizing for an RHBD OR gate 280d, the associated transistor sizing is similarly large where the total PMOS diffusion area, corresponding to PMOS transistors T1, T2, T5, is ×50 (i.e., ×20+×20+×10), and the total NMOS diffusion area, corresponding to NMOS transistors T3, T4, T6, is ×15 (i.e., ×5+×5+×5). Such large diffusion areas are in general undesirable because they in part contribute high error-rate as their cross-sections are large.

In view of the limitations of the transistor up-sizing and other RHBD techniques for digital circuits, there is need for techniques that mitigate SEEs and reduce the error-rate.

SUMMARY

The invention is defined in the independent claims. Further embodiments of the invention are defined in the dependent claims.

According to an embodiment, a circuit arrangement is provided. The circuit arrangement may include a first circuit configured to receive one or more input signals provided to the circuit arrangement, and a second circuit configured to provide one or more output signals of the circuit arrangement, wherein the first circuit includes a first pull-up network having at least one first transistor of a first conductivity type and a second transistor of a second conductivity type electrically coupled to each other, and a first pull-down network having a first transistor of the first conductivity type and at least one second transistor of the second conductivity type electrically coupled to each other, and wherein the second circuit includes a second pull-up network having a first transistor of the first conductivity type, and a second pull-down network having a second transistor of the second conductivity type, and wherein the first pull-up network and the second pull-down network are electrically coupled to each other, and wherein the first pull-down network and the second pull-up network are electrically coupled to each other.

According to an embodiment, a method for forming a circuit arrangement is provided. The method may include electrically coupling a first pull-up network of a first circuit and a second pull-down network of a second circuit to each other, and electrically coupling a first pull-down network of the first circuit and a second pull-up network of the second circuit to each other, wherein the first circuit is configured to receive one or more input signals provided to the circuit arrangement, wherein the second circuit is configured to provide one or more output signals of the circuit arrangement, wherein the first pull-up network includes at least one first transistor of a first conductivity type and a second transistor of a second conductivity type electrically coupled to each other, wherein the first pull-down network includes a first transistor of the first conductivity type and at least one second transistor of the second conductivity type electrically coupled to each other, wherein the second pull-up network includes a first transistor of the first conductivity type, and wherein the second pull-down network includes a second transistor of the second conductivity type.

According to an embodiment, a circuit arrangement for mitigating an effect of at least one transient voltage pulse generated in the circuit arrangement is provided. The circuit arrangement may include a first circuit and a second circuit, wherein the first circuit includes a pull-up network having a first pair of transistors of opposite conductivity types electrically coupled to each other, and a pull-down network having a second pair of transistors of opposite conductivity types electrically coupled to each other, wherein the pull-up network and the pull-down network are configured to receive one or more input signals, and further configured, in response to the one or more input signals received, for controlling the second circuit to provide one or more output signals.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which:

FIG. 1B shows the corresponding cross-sectional view where the PMOS transistor is struck, while

FIG. 1E shows the corresponding cross-sectional view where the NMOS transistor is struck, while

FIGS. 2A to 2B show schematic diagrams of inverters of the prior art, FIG. 2C shows a schematic diagram of a NOR gate of the prior art, and FIG. 2D shows a schematic diagram of an OR gate of the prior art.

FIG. 4A shows a schematic diagram of circuit arrangement, according to various embodiments, while

FIGS. 7A to 7C show schematic diagrams of pull-up and auxiliary pull-up networks of first stage circuits of circuit arrangements, according to various embodiments.

FIGS. 7D to 7F show schematic diagrams of pull-down and auxiliary pull-down networks of first stage circuits of circuit arrangements, according to various embodiments.

DETAILED DESCRIPTION

Figure 1A:
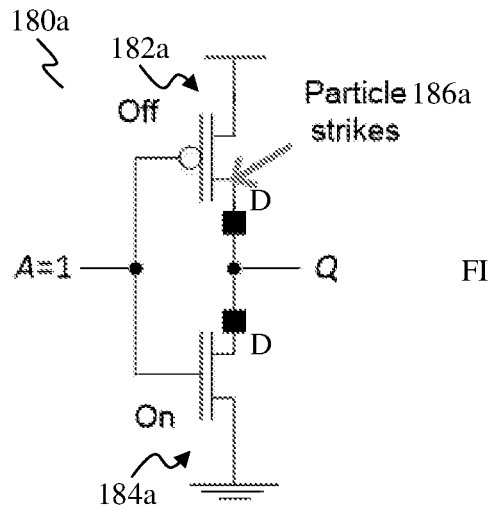
FIG. 1A shows a schematic diagram of an inverter whose PMOS transistor is Off and is struck by a radiation particle.
Figure 1B:
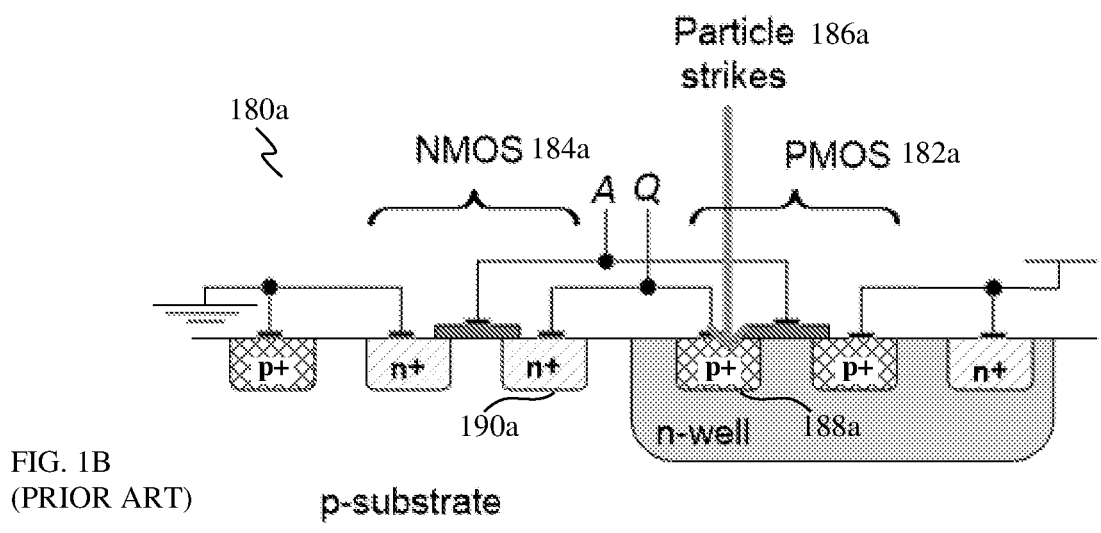
Figure 1C:
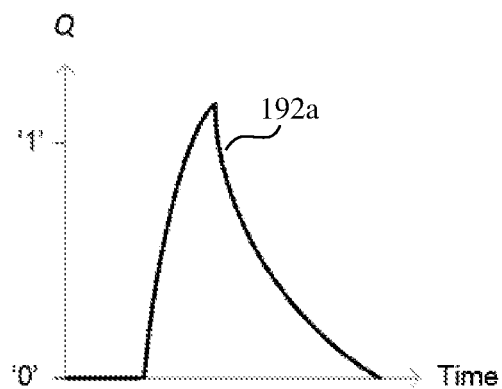
FIG. 1C shows a positive SET that is created.
Figure 1D:
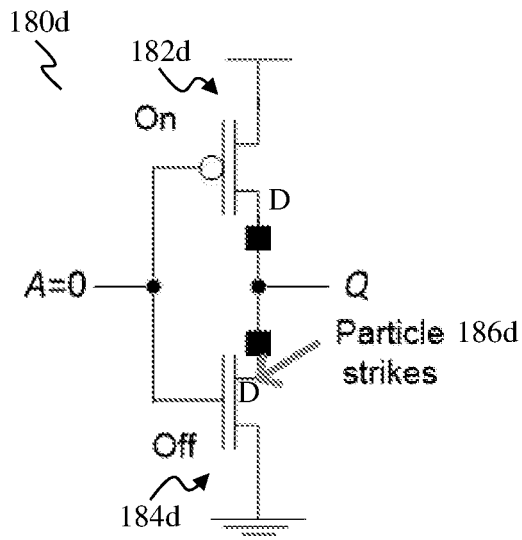
FIG. 1D shows a schematic diagram of an inverter whose NMOS transistor is Off and is struck by a radiation particle.
Figure 1E:
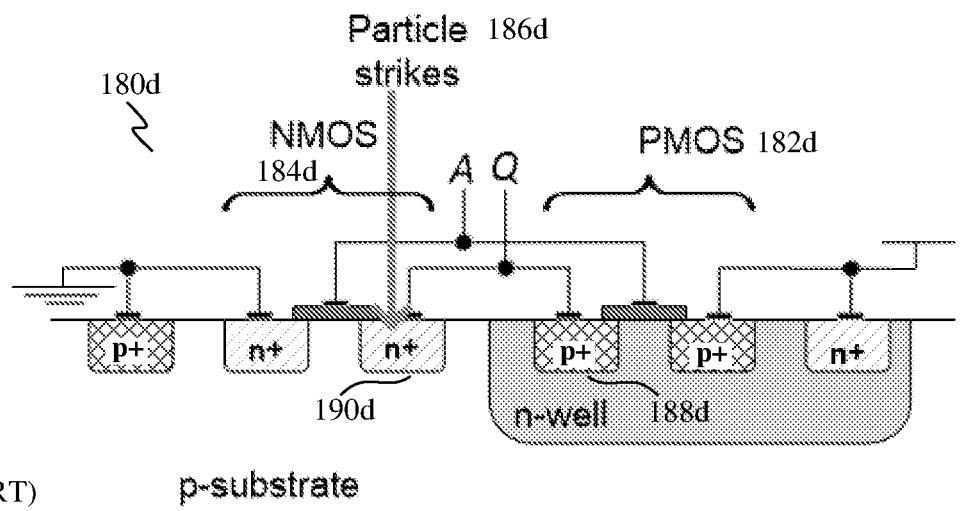
Figure 1F:
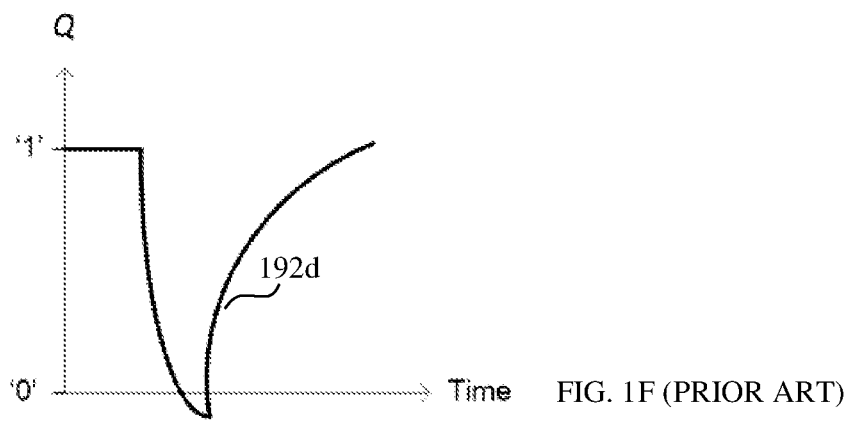
FIG. 1F shows a negative SET that is created.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other methods or devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the term "about" as applied to a numeric value encompasses the exact value and a reasonable variance.

As used herein, the term "and/or" includes any and all combinations of one or more of the associated listed items.

As used herein, the phrase of the form of "at least one of A or B" may include A or B or both A and B. Correspondingly, the phrase of the form of "at least one of A or B or C", or including further listed items, may include any and all combinations of one or more of the associated listed items.

Various embodiments may provide ultra-low error-rate circuit arrangements (e.g., digital gates).

Various embodiments may relate to transistor insertion-cum-connection techniques to realise one or more 2-stage circuit arrangements (or 2-stage digital gate(s)).

Various embodiments may pertain to Radiation-Hardened-By-Design (RHBD) techniques to mitigate SEEs in digital (logical) gates, for example, for S&S applications and for high-rel applications.

Various embodiments may provide transistor insertion-cum-connection techniques to virtually eliminate any SETs. For example, various embodiments may provide transistor insertion-cum-connection techniques for digital circuits where diffusion areas that cause SEEs may be very limited, hence, reducing the error-rate. The techniques may address the limitations of the known transistor up-sizing and other RHBD techniques for digital circuits.

Various embodiments may relate to transistor insertion-cum-connection techniques to realise a 2-stage digital gate (i.e., having first and second stages) that is radiation hardened to reduce soft errors, including errors due to single-event-transients (SETs). A split-logic with multiple stages of circuits may be provided. The techniques may involve the insertion of an NMOS transistor in a pull-up network in the first stage to drive a connecting pull-down network in the second stage, and the insertion of a PMOS transistor in a pull-down network in the first stage to drive a connecting pull-up network in the second stage. An auxiliary pull-up network in the first stage may be further introduced to drive the pull-up network in the second stage, and/or an auxiliary pull-down network in the first stage may be further introduced to drive the pull-down network in the second stage. The transistor insertion-cum-connection techniques may enable the first stage circuit to be virtually SET-free, hence, reducing the associated (soft) error-rate. On the basis of basic gate designs (including buffers and OR gates), the gate designs according to the techniques disclosed herein may have 2× to 74× lower error-rates than the designs having the known Radiation-Hardened-By-Design (RHBD) up-sizing technique. When compared to non-RHBD designs, the gate designs according to the techniques disclosed herein may have 7× to 215× lower error-rates.

Various embodiments may pertain to a transistor insertion-cum-connection technique for realizing a 2-stage digital gate where the first stage circuit may be virtually SET-tolerant. A circuit arrangement (e.g., a digital gate) may be provided, including a first stage circuit driven by at least one primary input, and a second stage circuit producing a primary output. The first stage circuit may include or embody at least one pull-up network, at least one auxiliary pull-up network, at least one pull-down network and at least one auxiliary pull-down network, and the second stage circuit may include or embody at least one pull-up network and at least one pull-down network. The at least one pull-up network of the first stage circuit may be connected to the at least one auxiliary pull-down network of the first stage circuit, the at least one pull-down network of the first stage circuit may be connected to the at least one auxiliary pull-up network of the first stage circuit, and the at least one pull-up network of the second stage circuit may be connected to the at least one pull-down network of the second stage circuit. The pull-up network of the first stage circuit may include at least one PMOS transistor and at least one NMOS transistor. The pull-down network of the first stage circuit may include at least one NMOS transistor and at least one PMOS transistor. The auxiliary pull-up network of the first stage circuit may include at least one PMOS transistor. The auxiliary pull-down network of the first stage circuit may include at least one NMOS transistor. The pull-up network of the second stage circuit may include at least one PMOS transistor. The pull-down network of the second stage circuit may include at least one NMOS transistor. The at least one NMOS transistor of the pull-up network of the first stage circuit may be connected to the at least one PMOS transistor of the pull-up network of the first stage circuit so that the former may enable the pull-down network of the second stage circuit, or otherwise, the auxiliary pull-down network of the first stage circuit may disable the pull-down network of the second stage circuit. The at least one PMOS transistor of the pull-down network of the first stage circuit may be connected to the at least one NMOS transistor of the pull-down network of the first stage circuit so that the former may enable the pull-up network of the second stage circuit, or otherwise, the auxiliary pull-up network of the first stage circuit may disable the pull-up network of the second stage circuit. When the pull-up network of the first stage circuit is 'ON' and the auxiliary pull-down network of the first stage circuit is 'OFF', their connecting NMOS transistors to enable the pull-down network of the second stage may be induced with a negative SET pulse to temporarily turn off the pull-down network of the second stage, but may not affect the primary output. When the pull-down network of the first stage circuit is 'OFF' and the auxiliary pull-up network of the first stage circuit is 'ON', their connecting PMOS transistors to disable the pull-up network of the second stage may be induced with a positive SET pulse to keep disabling the pull-up network of the second stage circuit. When the pull-down network of the first stage circuit is 'ON' and the auxiliary pull-up network of the first stage circuit is 'OFF', their connecting PMOS transistors to enable the pull-up network of the second stage may be induced with a positive SET pulse to temporarily turn off the pull-up network of the second stage, but may not affect the primary output. When the pull-up network of the first stage circuit is 'OFF' and the auxiliary pull-down network of the first stage circuit is 'ON', their connecting NMOS transistors to disable the pull-down network of the second stage may be induced with a negative SET pulse to keep disabling the pull-down network of the second stage circuit.

Various embodiments may provide a circuit arrangement including a first stage circuitry and a second stage circuitry, the first stage circuitry having a pull-up network with an NMOS transistor, an auxiliary pull-up network coupled to the pull-up network, a pull-down network with a PMOS transistor, and an auxiliary pull-down network coupled to the pull-down network, and the second stage circuitry having a pull-up network, and a pull-down network coupled to the pull-up network, wherein the NMOS transistor may be coupled to the auxiliary pull-down network of the first stage circuitry and the pull-down network of the second stage circuitry, and wherein the PMOS transistor may be coupled to the auxiliary pull-up network of the first stage circuitry and the pull-up network of the second stage circuitry. The circuit arrangement may include or may be a digital gate.

Various embodiments may further provide a method for designing a radiation hardened circuit arrangement, including providing a first stage circuitry having a pull-up network with an NMOS transistor, an auxiliary pull-up network coupled to the pull-up network, a pull-down network with a PMOS transistor, and an auxiliary pull-down network coupled to the pull-down network, providing a second stage circuitry having a pull-up network, and a pull-down network coupled to the pull-up network, coupling the NMOS transistor to the auxiliary pull-down network of the first stage circuitry and the pull-down network of the second stage circuitry, and coupling the PMOS transistor to the auxiliary pull-up network of the first stage circuitry and the pull-up network of the second stage circuitry. The circuit arrangement may include or may be a digital gate.

As a result of the inherent circuit configuration, various embodiments may virtually eliminate any SET pulse in the first stage circuit. In other words, the techniques disclosed herein may provide better SET hardening with low circuit overheads compared to known techniques.

Various embodiments may provide one or more of the following as compared to known methods: (i) low cross-section (low area region) that may be sensitive to SEEs (arising from strikes of particles), (ii) mitigation of SEEs in digital circuits, hence reducing the associated error rate, (iii) enable high linear energy transfer (LET) threshold for digital circuits. In view of the above, the techniques disclosed herein may provide for robust operation to mitigate SETs/SEUs.

Figure 3A:
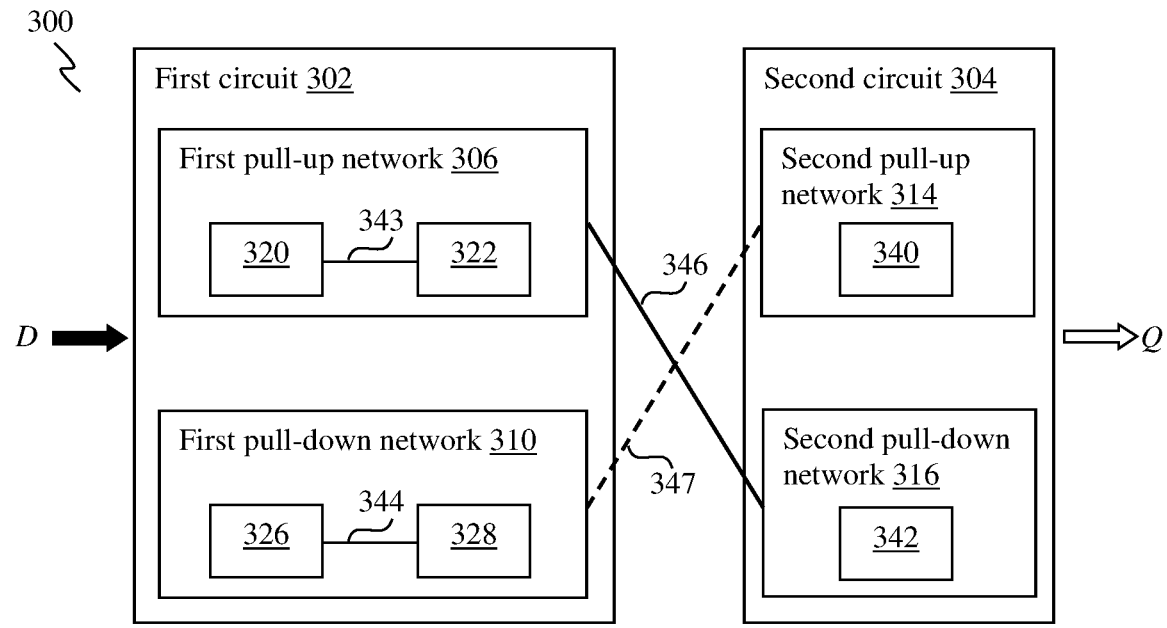
FIG. 3A shows a schematic view of a circuit arrangement, according to various embodiments.

FIG. 3A shows a schematic view of a circuit arrangement 300, according to various embodiments. The circuit arrangement 300 includes a first circuit 302 configured to receive one or more input signals (one input signal D is illustratively shown) provided to the circuit arrangement 300, and a second circuit 304 configured to provide one or more output signals (one output signal Q is illustratively shown) of the circuit arrangement 300, wherein the first circuit 302 includes a first pull-up network 306 having at least one first transistor 320 of a first conductivity type and a second transistor 322 of a second conductivity type electrically coupled (as represented by the line 343) to each other, and a first pull-down network 310 having a first transistor 326 of the first conductivity type and at least one second transistor 328 of the second conductivity type electrically coupled (as represented by the line 344) to each other, and wherein the second circuit 304 includes a second pull-up network 314 having a first transistor 340 of the first conductivity type, and a second pull-down network 316 having a second transistor 342 of the second conductivity type, and wherein the first pull-up network 306 and the second pull-down network 316 are electrically coupled (as represented by the line 346) to each other, and wherein the first pull-down network 310 and the second pull-up network 314 are electrically coupled (as represented by the dashed line 347) to each other.

In other words, a circuit arrangement 300 may be provided, having a plurality of circuits 302, 304, a plurality of pull-up networks 306, 314, a plurality of pull-down networks 310, 316, and a plurality of transistors 320, 322, 326, 328, 340, 342. In various embodiments, the first circuit 302 of the circuit arrangement 300 may be arranged such that the one or more input signals D may be provided to the first circuit 302. The first pull-up network 306 and the first pull-down network 310 may be connected to an input node of the circuit arrangement 300. As non-limiting examples, the first pull-up network 306 and the first pull-down network 310 may receive the one or more input signals D. For example, the at least one first transistor 320 and the at least one second transistor 328 may receive the one or more input signals D. The one or more input signals D may be received via the gate (G) terminals of the corresponding transistors 320, 328. It should be appreciated that each of the first pull-up network 306 and the first pull-down network 310 may receive a respective different input signal.

The second circuit 304 of the circuit arrangement 300 may be arranged such that the one or more output signals Q may be provided or outputted from the second pull-up network 314 and the second pull-down network 316. The second pull-up network 314 and the second pull-down network 316 may be connected to an output node of the circuit arrangement 300. The one or more output signals Q may be provided via the drain (D) terminals of the corresponding transistors 340, 342.

The first circuit 302 may include a first pull-up network 306 having one or more first transistors 320 of a first conductivity type and a second transistor 322 of a second conductivity type electrically coupled (or connected) to each other, and a first pull-down network 310 having a first transistor 326 of the first conductivity type and one or more second transistors 328 of the second conductivity type electrically coupled (or connected) to each other.

The second circuit 304 may include a second pull-up network 314 with a first transistor 340 of the first conductivity type, and a second pull-down network 316 with a second transistor 342 of the second conductivity type. The second pull-up network 314 and the second pull-down network 316 may be electrically coupled or connected to each other. The first transistor 340 and the second transistor 342 may be connected or electrically coupled to each other. The first transistor 340 and the second transistor 342 may define an inverter.

In various embodiments, the first circuit 302 and the second circuit 304 may be arranged such that the first pull-up network 306 and the second pull-down network 316 may be electrically coupled (or connected) to each other, and the first pull-down network 310 and the second pull-up network 314 may be electrically coupled (or connected) to each other. The second transistor 322 of the first pull-up network 306 and the second transistor 342 of the second pull-down network 316 may be connected or electrically coupled to each other. The first transistor 326 of the first pull-down network 310 and the first transistor 340 of the second pull-up network 314 may be connected or electrically coupled to each other.

The first pull-up network 306 may be connected to a power supply (e.g., $V_{DD}$). The at least one first transistor 320 and the second transistor 322 may be connected to a power supply (e.g., $V_{DD}$).

The first pull-down network 310 may be connected to ground (e.g., GND). The first transistor 326 and the at least one second transistor 328 may be connected to ground (e.g., GND).

The second pull-up network 314 may be connected to a power supply (e.g., $V_{DD}$). The first transistor 340 may be connected to a power supply (e.g., $V_{DD}$).

The second pull-down network 316 may be connected to ground (e.g., GND). The second transistor 342 may be connected to ground (e.g., GND).

The circuit arrangement 300 may be a 2-stage circuit arrangement, with the first circuit 302 defining a first stage circuit, and the second circuit 304 defining a second stage circuit.

In the context of various embodiments, the first circuit 302 may be SET-tolerant, due at least in part to the incorporation of the second transistor 322 of the second conductivity type in the first pull-up network 306 and the first transistor 326 of the first conductivity type in the first pull-down network 310.

In the context of various embodiments, a "pull-up network" may mean a network or circuit that may pull a voltage up towards a more positive value. For example, a pull-up network is capable of providing a low resistance path to a power supply (e.g., $V_{DD}$) in a first operation and provides a high resistance to the power supply in a second operation.

In the context of various embodiments, a "pull-down network" may mean a network or circuit that may pull a voltage down to a less positive value (or more negative value). For example, a pull-down network is capable of providing a low resistance path to ground (e.g., GND) in a first operation and provides a high resistance to ground in a second operation.

In the context of various embodiments, the first conductivity type and the second conductivity type may be opposite conductivity types or of opposite polarities. The first conductivity type may be a p-type conductivity and a transistor of the first conductivity type may be a P-type FET (Field Effect Transistors) (e.g., PMOS transistor, i.e., p-channel MOSFET or P-type FinFET, i.e., Fin FET), while the second conductivity type may be an n-type conductivity and a transistor of the second conductivity type may be an N-type FET (e.g., NMOS transistor, i.e., n-channel MOSFET, N-type FinFET).

In various embodiments, a source (S) terminal of the second transistor 322 of the first pull-up network 306 may be connected to a drain (D) terminal of the at least one first transistor 320 of the first pull-up network 306, a drain (D) terminal of the second transistor 322 of the first pull-up network 306 may be connected to a gate (G) terminal of the second transistor 342 of the second pull-down network 316, a drain (D) terminal of the first transistor 326 of the first pull-down network 310 may be connected to a gate (G) terminal of the first transistor 340 of the second pull-up network 314, and a source (S) terminal of the first transistor 326 of the first pull-down network 310 may be connected to a drain (D) terminal of the at least one second transistor 328 of the first pull-down network 310. A gate (G) terminal of the second transistor 322 of the first pull-up network 306 may be connected to a power supply (e.g., $V_{DD}$). A gate (G) terminal of the first transistor 326 of the first pull-down network 310 may be connected to ground (e.g., GND).

It should be appreciated that the source (S) terminal and the drain (D) terminal of a transistor (e.g., a field effect transistor (FET)) are interchangeable, and the output of a transistor is generally the drain (D) terminal of the transistor.

In a first mode of operation, in response to a first input signal (e.g., 0) received, the first pull-up network 306 may be configured to be electrically conductive to turn on (or enable) the second pull-down network 316 to provide a first output signal (e.g., 0), and, in a second mode of operation, in response to a second input signal (e.g., 1) received, the first pull-down network 310 may be configured to be electrically conductive to turn on (or enable) the second pull-up network 314 to provide a second output signal (e.g., 1). In response to the first input signal received in the first mode of operation, the first pull-down network 310 may be configured to be electrically non-conductive. In response to the second input signal received in the second mode of operation, the first pull-up network 306 may be configured to be electrically non-conductive.

In various embodiments, the circuit arrangement 300 may further include an auxiliary pull-up network electrically coupled (or connected) to the first pull-down network 310 and the second pull-down network 314, the auxiliary pull-up network having at least one first auxiliary transistor of the first conductivity type, and an auxiliary pull-down network electrically coupled (or connected) to the first pull-up network 306 and the second pull-down network 316, the auxiliary pull-down network having at least one second auxiliary transistor of the second conductivity type. The auxiliary pull-up network may further be electrically coupled (or connected) to the first pull-up network 306. The auxiliary pull-down network may further be electrically coupled (or connected) to the first pull-down network 310.

A drain (D) terminal of the at least one first auxiliary transistor may be connected to a drain (D) terminal of the first transistor 326 of the first pull-down network 310 and to a gate (G) terminal of the first transistor 340 of the second pull-up network 314, and a drain (D) terminal of the at least one second auxiliary transistor may be connected to a drain (D) terminal of the second transistor 322 of the first pull-up network 306 and to a gate (G) terminal of the second transistor 342 of the second pull-down network 316. A source (S) terminal of the at least one first auxiliary transistor may be connected to a power supply (e.g., $V_{DD}$). The at least one first auxiliary transistor may receive the one or more input signals D via its gate terminal A source (S)

terminal of the at least one second auxiliary transistor may be connected to ground (e.g., GND). The at least one second auxiliary transistor may receive the one or more input signals D via its gate terminal.

In a first mode of operation, in response to a first input signal (e.g., 0) received, the first pull-up network 306 may be configured to be electrically conductive to turn on (or enable) the second pull-down network 316 to provide a first output signal (e.g., 0), and the auxiliary pull-up network may be configured to be electrically conductive to turn off (or disable) the second pull-up network 314, and, in a second mode of operation, in response to a second input signal (e.g., 1) received, the first pull-down network 310 may be configured to be electrically conductive to turn on (or enable) the second pull-up network 314 to provide a second output signal (e.g., 1), and the auxiliary pull-down network may be configured to be electrically conductive to turn off (or disable) the second pull-down network 316. In response to the first input signal received in the first mode of operation, the first pull-down network 310 and the auxiliary pull-down network may be configured to be electrically non-conductive. In response to the second input signal received in the second mode of operation, the first pull-up network 306 and the auxiliary pull-up network may be configured to be electrically non-conductive.

In various embodiments, the at least one first transistor 320 of the first pull-up network 306 may include a plurality of first transistors of the first conductivity type, the plurality of first transistors being electrically coupled to each other and to the second transistor 322 of the first pull-up network 306, and the plurality of first transistors may be arranged in at least one of a stacking connection or a parallel connection. This may mean that the plurality of first transistors may be stacking (or series) transistors, or may be connected in parallel to each other, or may be connected in a combination of stacking and parallel connections. The plurality of first transistors may receive the one or more input signals D. Different input signals may be received by different transistors of the plurality of first transistors.

In the context of various embodiments, a stacking transistor (i.e., a transistor as part of a stacking connection) means a transistor that is connected in series with another transistor of the same conductivity type to drive an output.

In various embodiments, the at least one second transistor 328 of the first pull-down network 310 may include a plurality of second transistors of the second conductivity type, the plurality of second transistors being electrically coupled to each other and to the first transistor 326 of the first pull-down network 310, and the plurality of second transistors may be arranged in at least one of a stacking connection or a parallel connection. This may mean that the plurality of second transistors may be stacking (or series) transistors, or may be connected in parallel to each other, or may be connected in a combination of stacking and parallel connections. The plurality of second transistors may receive the one or more input signals D. Different input signals may be received by different transistors of the plurality of second transistors.

In various embodiments, the at least one first auxiliary transistor may include a plurality of first auxiliary transistors of the first conductivity type, the plurality of first auxiliary transistors being electrically coupled to each other and to the first transistor 326 of the first pull-down network 310, and the plurality of first auxiliary transistors may be arranged in at least one of a stacking connection or a parallel connection. This may mean that the plurality of first auxiliary transistors may be stacking (or series) transistors, or may be connected in parallel to each other, or may be connected in a combination of stacking and parallel connections. The plurality of first auxiliary stacking transistors may receive the one or more input signals D. Different input signals may be received by different transistors of the plurality of first auxiliary stacking transistors.

In various embodiments, the at least one second auxiliary transistor may include a plurality of second auxiliary transistors of the second conductivity type, the plurality of second auxiliary transistors being electrically coupled to each other and to the second transistor 322 of the first pull-up network 306, and the plurality of second auxiliary transistors may be arranged in at least one of a stacking connection or a parallel connection. This may mean that the plurality of second auxiliary transistors may be stacking (or series) transistors, or may be connected in parallel to each other, or may be connected in a combination of stacking and parallel connections. The plurality of second auxiliary transistors may receive the one or more input signals D. Different input signals may be received by different transistors of the plurality of second auxiliary transistors.

In various embodiments, a source (S) terminal of the at least one first auxiliary transistor of the auxiliary pull-up network may be connected to a source (S) terminal of a first transistor of the plurality of first transistors of the first pull-up network 306. This may mean that the source (S) terminal of the at least one first auxiliary transistor may be connected to the source (S) terminal of any one transistor of the plurality of first transistors.

In various embodiments, a source (S) terminal of the at least one second auxiliary transistor of the auxiliary pull-down network may be connected to a source (S) terminal of a second transistor of the plurality of second transistors of the first pull-down network 310. This may mean that the source (S) terminal of the at least one second auxiliary transistor may be connected to the source (S) terminal of any one transistor of the plurality of second transistors.

In various embodiments, a source (S) terminal of the at least one first auxiliary transistor of the auxiliary pull-up network may be connected to a source (S) terminal of the second transistor 322 of the first pull-up network 306, and a gate (G) terminal of the at least one first auxiliary transistor of the auxiliary pull-up network may be connected to a drain (D) terminal of the first transistor 340 of the second pull-up network 314 and to a drain (D) terminal of the second transistor 342 of the second pull-down network 316.

In various embodiments, a source (S) terminal of the at least one second auxiliary transistor of the auxiliary pull-down network may be connected to a source (S) terminal of the first transistor 326 of the first pull-down network 310, and a gate (G) terminal of the at least one second auxiliary transistor of the auxiliary pull-down network may be connected to a drain (D) terminal of the first transistor 340 of the second pull-up network 314 and to a drain (D) terminal of the second transistor 342 of the second pull-down network 316.

In various embodiments, for the first transistor 326 of the first pull-down network 310, the first transistor 326 may be adapted for body-biasing by means of a first biasing signal applied to the first transistor 326 to control a threshold voltage of the first transistor 326, and, for the second transistor 322 of the first pull-up network 306, the second transistor 322 may be adapted for body-biasing by means of a second biasing signal applied to the second transistor 322 to control a threshold voltage of the second transistor 322.

Each of the second transistor 322 and the first transistor 326 may include a fully-depleted silicon-on-insulator (FDSOI) transistor.

In various embodiments, the first circuit 302 may include a plurality of cascading (series) sub-circuits electrically coupled to each other, wherein each cascading sub-circuit of the plurality of cascading sub-circuits may include a pull-up network having at least one first transistor of a first conductivity type and a second transistor of a second conductivity type electrically coupled (or connected) to each other, and a pull-down network having a first transistor of the first conductivity type and at least one second transistor of the second conductivity type electrically coupled (or connected) to each other, and, wherein, for a last cascading sub-circuit of the plurality of cascading sub-circuits, the pull-up network may be defined by the first pull-up network 306, and the pull-down network may be defined by the first pull-down network 310. Here, the last cascading sub-circuit may refer to the cascading sub-circuit that may be arranged furthest from a front cascading sub-circuit of the plurality of cascading sub-circuits that may receive the one or more input signals D. The operation of the last cascading sub-circuit may be based, at least in part, on an output signal provided by one or more of the preceding cascading sub-circuits.

For the each cascading sub-circuit, the cascading sub-circuit may further include an auxiliary pull-up network electrically coupled to the pull-down network, the auxiliary pull-up network having at least one first auxiliary transistor of the first conductivity type, and an auxiliary pull-down network electrically coupled to the pull-up network, the auxiliary pull-down network having at least one second auxiliary transistor of the second conductivity type.

For the last cascading sub-circuit, the auxiliary pull-up network may be further electrically coupled to the second pull-up network 314, and the auxiliary pull-down network may be further electrically coupled to the second pull-down network 316.

In greater details, the first circuit 302 may include a plurality of cascading (series) sub-circuits electrically coupled to each other, where the plurality of cascading sub-circuits may include a front cascading sub-circuit, and a last cascading sub-circuit, wherein the front cascading sub-circuit may include a front pull-up network having at least one first transistor of a first conductivity type and a second transistor of a second conductivity type electrically coupled (or connected) to each other, and a front pull-down network having a first transistor of the first conductivity type and at least one second transistor of the second conductivity type electrically coupled (or connected) to each other, and wherein the last cascading sub-circuit may include a last pull-up network defined by the first pull-up network 306, and a last pull-down network defined by the first pull-down network 310. The operation of the last cascading sub-circuit may be based, at least in part, on an output signal provided by the front cascading sub-circuit.

The front cascading sub-circuit may further include a front auxiliary pull-up network electrically coupled (or connected) to the front pull-down network, the front auxiliary pull-up network having at least one first auxiliary transistor of the first conductivity type, and a front auxiliary pull-down network electrically coupled (or connected) to the front pull-up network, the front auxiliary pull-down network having at least one second auxiliary transistor of the second conductivity type.

The last cascading sub-circuit may further include a last auxiliary pull-up network electrically coupled (or connected) to the last pull-down network and the second pull-up network 314, the last auxiliary pull-up network having at least one first auxiliary transistor of the first conductivity type, and a last auxiliary pull-down network electrically coupled (or connected) to the last pull-up network and the second pull-down network 316, the last auxiliary pull-down network having at least one second auxiliary transistor of the second conductivity type.

The plurality of cascading sub-circuits may further include at least one intermediate cascading sub-circuit arranged in an electrical path between the front cascading sub-circuit and the last cascading sub-circuit, wherein, for each intermediate cascading sub-circuit of the at least one intermediate cascading sub-circuit, the intermediate cascading sub-circuit may include an intermediate front pull-up network having at least one first transistor of a first conductivity type and a second transistor of a second conductivity type electrically coupled (or connected) to each other, and an intermediate pull-down network having a first transistor of the first conductivity type and at least one second transistor of the second conductivity type electrically coupled (or connected) to each other. The intermediate cascading sub-circuit may further include an intermediate auxiliary pull-up network electrically coupled (or connected) to the intermediate pull-down network, the intermediate auxiliary pull-up network having at least one first auxiliary transistor of the first conductivity type, and an intermediate auxiliary pull-down network electrically coupled (or connected) to the intermediate pull-up network, the intermediate auxiliary pull-down network having at least one second auxiliary transistor of the second conductivity type.

In various embodiments, for each of the first transistor 340 of the second pull-up network 314, and the second transistor 342 of the second pull-down network 316, the transistor 340, 342 may be configured to drive a load associated with the transistor 340, 342, and the first transistor 340 of the second pull-up network 314, or the second transistor 342 of the second pull-down network 316 may have an aspect ratio that may be sized larger than an aspect ratio of a transistor that may be optimized for driving the load. For example, each transistor 340, 342 may drive a load associated with the transistor 340, 342 and, at least one of the transistors 340, 342 may have an aspect ratio that may be sized larger (enlarged) than an aspect ratio of a transistor that is optimized ("optimized transistor") for driving the load. In various embodiments, a transistor may be optimized in terms of at least one of speed, area, or power dissipation, meaning that the sizing of an optimized transistor may be kept to be as small as possible subject to meeting at least one of the speed, power or area constraints. This may mean that at least one of the transistors 340, 342 may be an up-sized transistor as compared to a transistor with a standard aspect ratio (see later for explanation). "Up-sizing" here means that a transistor has an even larger aspect ratio than that of a standard transistor. The value of the aspect ratio to be designed may depend on the linear energy transfer (LET) threshold of the corresponding circuit arrangement.

In the context of various embodiments, the load that may be driven by a transistor may include the total capacitive load, including the internal capacitance contributed by the drain of the transistor, and, if any, the external capacitance contributed by the gate or drain of a connecting transistor or circuit, or by wires.

In the context of various embodiments, the term "aspect ratio" as applied to a transistor means the ratio of the width, W, of the transistor to the length, L, of the transistor, i.e., aspect ratio=W/L. The aspect ratio of a transistor, the width, W, of a transistor, and the length, L, of a transistor are terms familiar to the skilled person. The length, L, refers to the length of the gate of the transistor, while the width, W, refers to the width of the drain and/or the source of the transistor. The length, L, is generally fixed by the fabrication technology used, for example, 65 nm fabrication process. The width, W, may be controlled, for example, to match the length, L, so that the resulting aspect ratio (i.e., W/L) is one, or to be larger than the length, L, so that the resulting aspect ratio is more than one. Generally (but not fixed for various fabrication processes), the minimum width of W (termed as $W_{min}$) is about 2 times of L. Further, the current level of a transistor is generally related to or determined by the width, W, where the current, $I_D \propto W/L$. As such, by providing a larger width, W, where $W>>W_{min}$ such that the corresponding aspect ratio is >>1, the current level for the transistor is increased such that there may be a stronger driving current. On earth conditions, for circuits (e.g., digital circuits), for a standard transistor, the width W is preferably sized to be $W_{min}$, or a slightly larger value as long as the overall circuit just meets the speed, area or power dissipation specifications. For S&S condition, the width W may be increased beyond the standard transistor sizing for mitigating the effect of SEEs.

In the context of various embodiments, for an up-sized transistor, the corresponding aspect ratio may be more than 2, e.g., ≥2.5, ≥3, ≥5, ≥6, ≥8, ≥10, ≥20, ≥50 or ≥100, or between about 2.1 and about 100, between about 2.1 and about 50, between about 2.1 and about 20, between about 2.1 and about 10, between about 2.5 and about 100, between about 2.5 and about 50, between about 2.5 and about 20, between about 2.5 and about 10, or between about 5 and about 20. As a non-limiting example, the aspect ratio may be at least 2.5.

In the context of various embodiments, the circuit arrangement 300 may be or may include a digital gate, e.g., a buffer gate, an OR gate, an AND gate, etc.

Figure 3B:
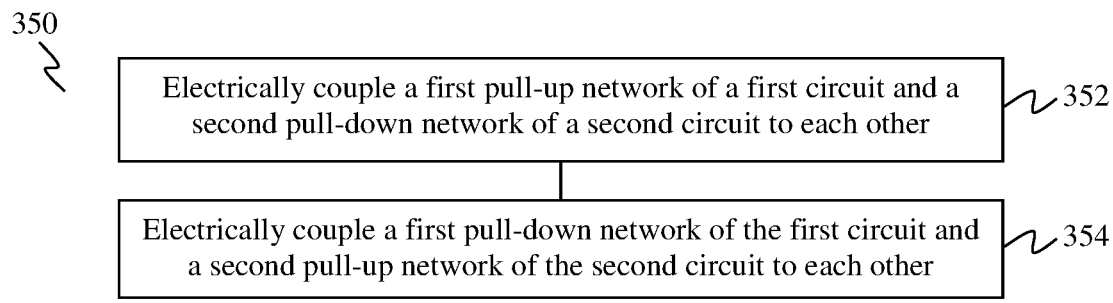
FIG. 3B shows a flow chart illustrating a method for forming a circuit arrangement, according to various embodiments.

FIG. 3B shows a flow chart 350 illustrating a method for forming a circuit arrangement, according to various embodiments.

At 352, a first pull-up network of a first circuit and a second pull-down network of a second circuit are electrically coupled to each other. At 354, a first pull-down network of the first circuit and a second pull-up network of the second circuit are electrically coupled to each other. The first circuit is configured to receive one or more input signals (e.g., D) provided to the circuit arrangement, while the second circuit is configured to provide one or more output signals (e.g., Q) of the circuit arrangement. The first pull-up network includes at least one first transistor of a first conductivity type and a second transistor of a second conductivity type electrically coupled to each other, the first pull-down network includes a first transistor of the first conductivity type and at least one second transistor of the second conductivity type electrically coupled to each other, the second pull-up network includes a first transistor of the first conductivity type, and the second pull-down network includes a second transistor of the second conductivity type.

The method may further include electrically coupling an auxiliary pull-up network to the first pull-down network and to the second pull-up network, the auxiliary pull-up network having at least one first auxiliary transistor of the first conductivity type, and electrically coupling an auxiliary pull-down network to the first pull-up network and to the second pull-down network, the auxiliary pull-down network having at least one second auxiliary transistor of the second conductivity type.

It should be appreciated that descriptions in the context of the circuit arrangement 300 may correspondingly be applicable in relation to the method for forming a circuit arrangement described in the context of the flow chart 350.

Figure 3C:
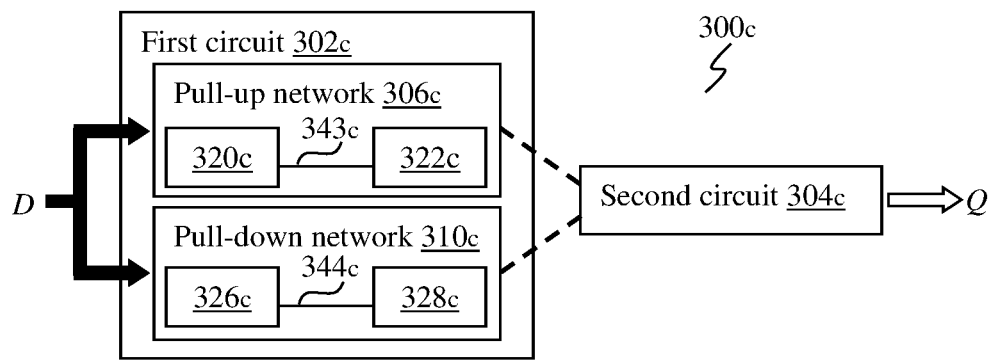
FIG. 3C shows a schematic view of a circuit arrangement, according to various embodiments.

FIG. 3C shows a schematic view of a circuit arrangement 300c for mitigating an effect of at least one transient voltage pulse generated in the circuit arrangement 300c, according to various embodiments. The circuit arrangement 300c includes a first circuit 302c and a second circuit 304c, wherein the first circuit 302c includes a pull-up network 306c having a first pair of transistors 320c, 322c of opposite conductivity types electrically coupled (as represented by the line 343c) to each other, and a pull-down network 310c having a second pair of transistors 326c, 328c of opposite conductivity types electrically coupled (as represented by the line 344c) to each other, wherein the pull-up network 306c and the pull-down network 310c are configured to receive one or more input signals (one input signal D is illustratively shown), and further configured, in response to the one or more input signals D received, for controlling the second circuit 304c to provide one or more output signals (one output signal Q is illustratively shown). While the circuit arrangement 300c is illustrated in FIG. 3C such that the pull-up network 306c and the pull-down network 310c receive the same input signal D, it should be appreciated that each of the pull-up network 306c and the pull-down network 310c may receive a respective different input signal.

The pull-up network 306c may be configured for setting a first electrical potential level at the second circuit 304c. The pull-down network 310c may be configured for setting a second electrical potential level at the second circuit 304c.

In various embodiments, the at least one transient voltage pulse may be generated in the first circuit 302c (for example, due to an energised particle striking the first circuit 302c), where the first pair of transistors 320c, 322c and the second pair of transistors 326c, 328c may mitigate an effect of the at least one transient voltage pulse on the one or more output signals Q.

It should be appreciated that the circuit arrangement 300c, including the various components and connections thereof, may be as described in the context of the circuit arrangement 300. Further, it should be appreciated that the circuit arrangement 300c may include additional components similar to those as described in the context of the circuit arrangement 300.

Various embodiments may further provide a method for forming the circuit arrangement 300c.

Figure 4A:
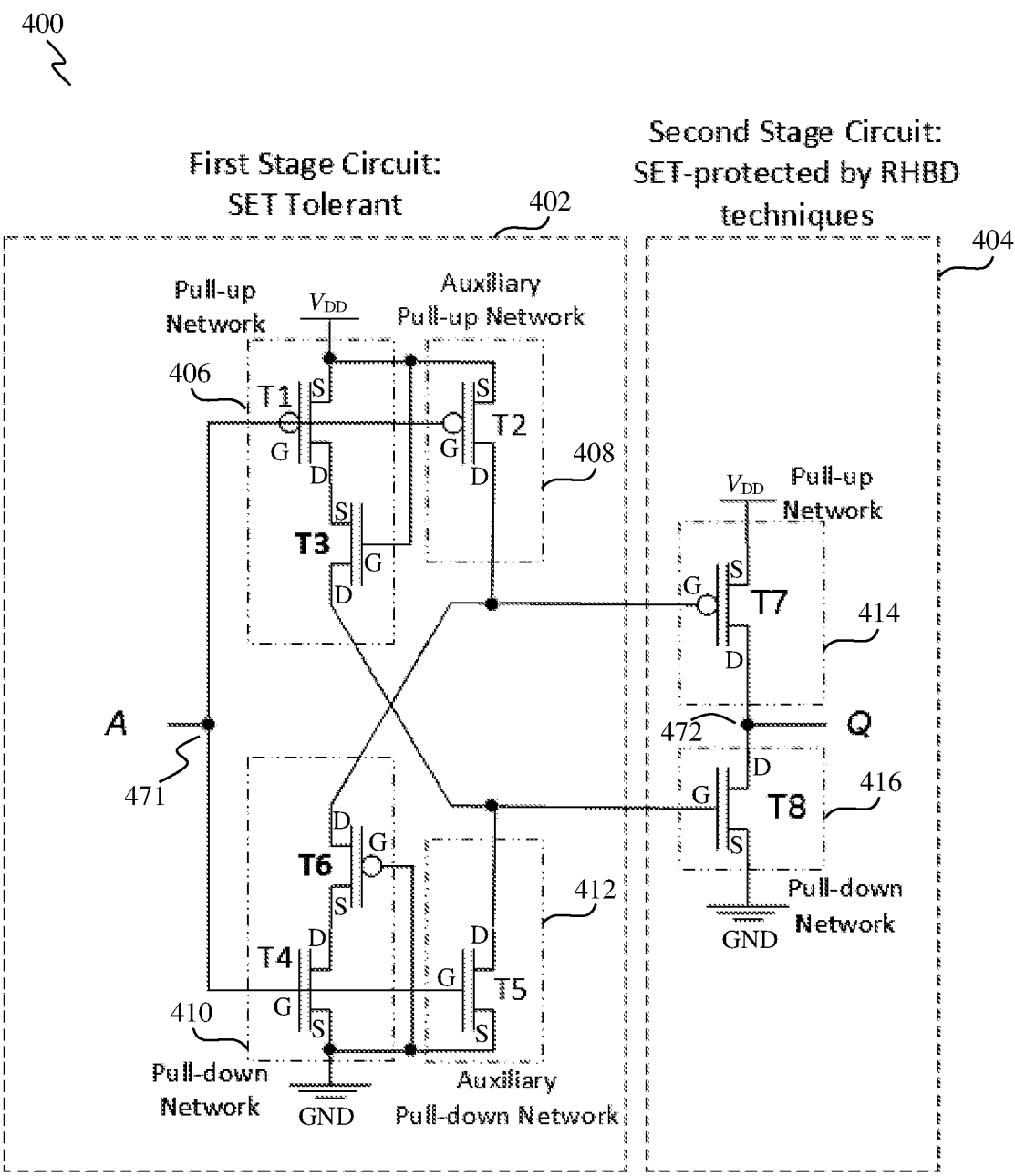

FIG. 4A shows a schematic diagram of circuit arrangement 400, according to various embodiments. The circuit arrangement 400 may be a (digital) buffer gate. The circuit arrangement 400 may receive a primary input signal A, for example via an input node 471, and provide a primary output signal Q, for example via an output node 472. The circuit arrangement 400 may be a 2-stage circuit arrangement (e.g., a 2-stage digital gate) having a first stage circuit 402 and a second stage circuit 404 connected or electrically coupled to each other. The first stage circuit 402 may be virtually SET tolerant, protected by techniques that will be described further below, and the second stage circuit 404 is a driver which may be protected by RHBD practices such as transistor up-sizing, and/or layout techniques.

The first stage circuit 402 may have a split-transistor configuration, having a pull-up network 406, an auxiliary pull-up network 408, a pull-down network 410, and an auxiliary pull-down network 412. The pull-up network 406 may include a PMOS transistor T1 and an NMOS transistor T3. The pull-down network 410 may include a PMOS transistor T6 and an NMOS transistor T4. A reason why the first stage circuit 402 may be SET tolerant is because of the insertion of the NMOS transistor T3 in the pull-up network 406, and the insertion of the PMOS transistor T6 in the pull-down network 410. The insertion of these two transistors T3, T6 in the first stage circuit 402 may virtually eliminate any SET that may otherwise erroneously trigger the second stage circuit 404. Accordingly, there is provided insertion of two transistors T3, T6, in the split-transistor configuration. The PMOS transistor T2 defines or is comprised in the auxiliary pull-up network 408, while the NMOS transistor T5 defines or is comprised in the auxiliary pull-down network 412. The transistors T2, T5 serve to maintain the voltage level for proper logic operation and yet SET-tolerant.

The second stage circuit 404 may include a pull-up network 414 and a pull-down network 416 connected or electrically coupled to each other. The pull-up network 414 may include a PMOS transistor T7, while the pull-down network 416 may include an NMOS transistor T8. The PMOS transistor T7 and the NMOS transistor T8 may together define an inverter.

The pull-up network 406 and the auxiliary pull-up network 408 may be connected or electrically coupled to each other. The pull-up network 406, the auxiliary pull-up network 408, and the pull-down network 416 may be electrically coupled to each other. The pull-down network 410, and the auxiliary pull-down network 412 may be connected or electrically coupled to each other. The pull-down network 410, the auxiliary pull-down network 412, and the pull-up network 414 may be electrically coupled to each other.

In greater detail, the gate (G) terminals of the transistors T1, T2, T4, T5 may receive the input signal A. These gate (G) terminals of the transistors T1, T2, T4, T5 may, for example, be connected to or at the input node 471. The source (S) terminals of the PMOS transistors T1, T2 and the gate (G) terminal of the NMOS transistor T3 may be connected to a power supply (e.g., $V_{DD}$). The drain (D) terminal of the PMOS transistor T1 and the source (S) terminal of the NMOS transistor T3 may be connected to each other. The source (S) terminals of the NMOS transistors T4, T5 and the gate (G) terminal of the PMOS transistor T6 may be connected to ground (e.g., GND). The drain (D) terminal of the NMOS transistor T4 and the source (S) terminal of the PMOS transistor T6 may be connected to each other. The drain (D) terminals of the PMOS transistors T2, T6 and the gate (G) terminal of the PMOS transistor T7 may be connected to each other. The drain (D) terminals of the NMOS transistors T3, T5 and the gate (G) terminal of the NMOS transistor T8 may be connected to each other. The source (S) terminal of the PMOS transistor T7 may be connected to a power supply (e.g., $V_{DD}$). The source (S) terminal of the NMOS transistor T8 may be connected to ground (e.g., GND). The drain (D) terminals of the PMOS transistor T7 and the NMOS transistor T8 may be connected to each other. The output signal Q may be provided from the drain (D) terminals of the transistors T7, T8. These drain (D) terminals of the transistors T7, T8 may, for example, be connected to or at the output node 472.

The overall first stage circuit 402 may be SET tolerant, meaning that the output Q in the second stage circuit 404 may not induce any error due to any SETs in the first stage circuit 402. By using a single-input buffer gate as a non-limiting example for illustration, two scenarios for analyses will be considered as follows.

Figure 4B:
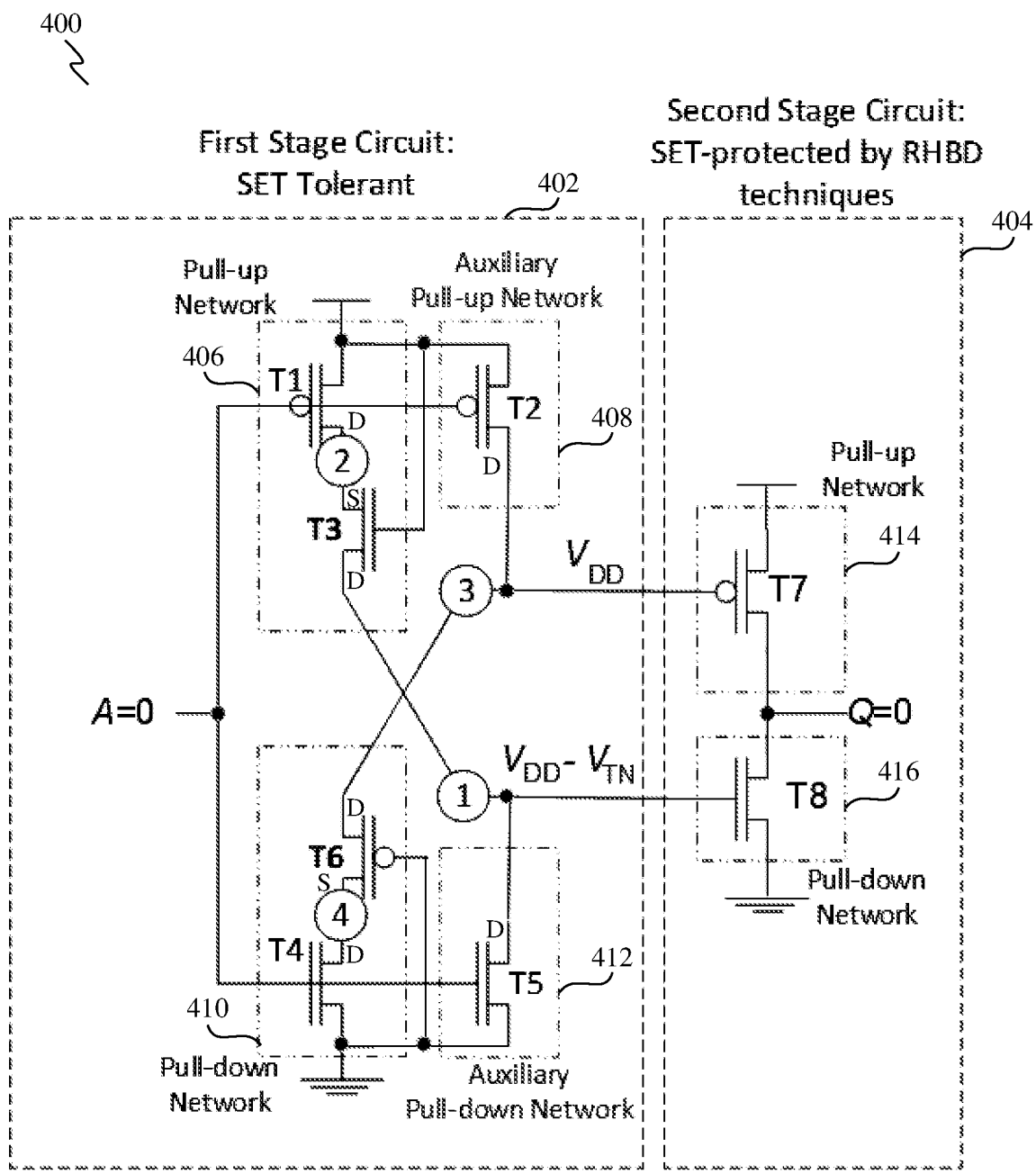
FIGS. 4B and 4C show schematic diagrams of the circuit arrangement when A='0' and when A='1' respectively.

The first scenario is when A='0', and analysis is carried out with reference to FIG. 4B illustrating the circuit arrangement 400 with four internal Nodes 1 to 4 (identified by the respective numbers within circles in FIG. 4B) in the first stage circuit 402. When A='0', the pull-up network 406 of the first stage circuit 402 is conductive, where the PMOS transistor T1 first charges Node 2 to $V_{DD}$, and the NMOS transistor T3 continues to charge Node 1 to $V_{DD}-V_{TN}$, where a voltage drop of $V_{TN}$ (i.e., threshold voltage of NMOS transistor T3) is experienced. The voltage level $V_{DD}-V_{TN}$ of Node 1 may be strong enough, turning on the pull-down network 416 of the second stage circuit 404, i.e., by turning on the NMOS transistor T8 to make Q='0'. The auxiliary pull-up network 408 of the first stage circuit 402 is also conductive, where the PMOS transistor T2 charges Node 3 to $V_{DD}$, hence turning off the pull-up network 414 of the second stage circuit 404 (i.e., the PMOS transistor T7 is off). The pull-down network 410 and the auxiliary pull-down network 412 of the first stage circuit 402 are not conductive in this first scenario. Nodes 1 to 4 will now be analysed to delineate why the striking of an energy particle may not affect the first stage circuit 402 to cause an error at the output Q.

At Node 1, any energized particle hitting either drain (D) terminals of the NMOS transistors T3 or T5 may create a negative SET pulse, driving $V_{DD}-V_{TN}$ to a lower voltage level (e.g., 0V) and then possibly temporarily turning off the NMOS transistor T8. However, the negative SET pulse is very short (e.g., <250 ps), hence the NMOS transistor T8 may be turned on again thereafter. As the PMOS transistor T7 remains off (during the transient), Q may never be charged up and may remain as '0', and, hence no error.

At Node 2, there are two cases, where an energized particle may hit either at the source (S) terminal of the NMOS transistor T3 or at the drain (D) terminal of the PMOS transistor T1. In the former case, the effect is the same as that described above in relation to Node 1, where the voltage of Node 1 may be lower (via the NMOS transistor T3 as the resistive path). Put simply, no error may appear at Q. In the latter situation, because the affected transistor is a PMOS transistor, a positive SET pulse may result, hence, further charging up the voltage level of Node 2 and then of Node 1 (via the resistive path) to be even higher. This may continue turning on the NMOS transistor T8, and, hence no error.

At Node 3, any energized particle hitting either the drain (D) terminals of the PMOS transistors T2 or T6 may create a positive SET pulse, charging up $V_{DD}$ to an even higher voltage level. This may continue turning off the PMOS transistor T7, and, hence no error.

At Node 4, there are two cases, hitting either at the source (S) terminal of the PMOS transistor T6 or at the drain (D) terminal of the NMOS transistor T4. In the former case, the effect is the same as that described above in relation to Node 3, where the voltage of Node 3 may be higher (via the PMOS transistor T6 as the resistive path). Put simply, no error may appear at Q. In the latter situation, because the affected transistor is an NMOS transistor, a negative SET pulse may result, hence, possibly discharging the voltage level of Node 4 and then of Node 3 (via the resistive path). However, the resistive path of the PMOS transistor T6 may take time for delay propagation. Such delay may be able to serve as a time filter to attenuate the pulse transferred over to Node 3. Further, there may be a $V_{TP}$ drop over the PMOS transistor T6 (where $V_{TP}$ is the threshold voltage of PMOS transistor T6), restricting Node 3 to be fully discharged. The amount of voltage attenuation may further be controlled through the sizing of the PMOS transistor T6. Yet further, the PMOS transistor T2 is on, helping to maintain the voltage level of $V_{DD}$ for Node 3. Therefore, as a result of one or more of the above-mentioned effects, the voltage drop at Node 4 is unlikely to cause a large voltage drop at Node 3, hence, an output error is unlikely.

Having analysed Nodes 1 to 4, any SETs (if induced) in the first stage circuit 402 may be unlikely to cause an error in the second stage circuit 404, and, hence, the first stage circuit 402 may be virtually SET-tolerant even at a high Linear Energy Transfer (LET) level. Hence, the overall circuit arrangement (or digital gate) 400 may effectively have a very low cross-section. The second stage circuit 404 may have a cross section that may be susceptible to SET but may be designed to be SET-tolerant by RHBD means—this is relatively inexpensive as this second stage circuit 404 may simply be an inverter.

Figure 4C:
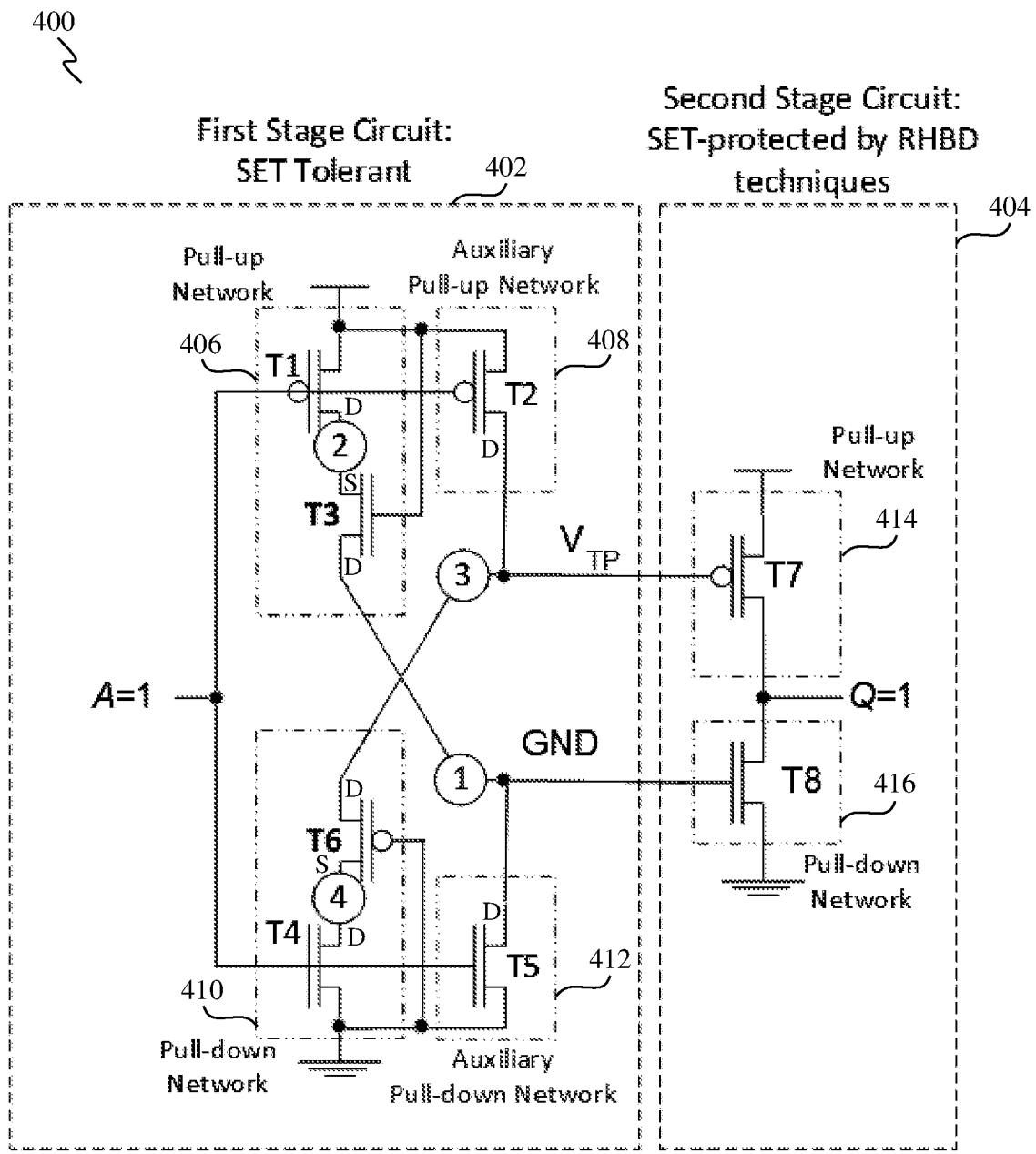

The second scenario is when A='1', and analysis is carried out with reference to FIG. 4C illustrating the circuit arrangement 400 with the same four internal Nodes 1 to 4 (identified by the respective numbers within circles in FIG. 4C) in the first stage circuit 402. When A='1', the pull-down network 410 of the first stage circuit 402 is conductive where the NMOS transistor T4 first discharges Node 4 to GND, and the PMOS transistor T6 continues to discharge Node 3 to $V_{TP}$, where a voltage drop of $V_{TP}$ (i.e., threshold voltage of PMOS transistor T6) is experienced. The voltage level $V_{TP}$ of Node 3 may be strong enough, turning on the pull-up network 414 of the second stage circuit 404, i.e., by turning on the PMOS transistor T7 to make Q='1'. The auxiliary pull-down network 412 of the first stage circuit 402 is also conductive where the NMOS transistor T5 discharges Node 1 to GND, hence turning off the pull-down network 416 of the second stage circuit 404 (i.e., the NMOS transistor T8 is off). The pull-up network 406 and the auxiliary pull-up network 408 of the first stage circuit 402 are not conductive in this second scenario. Nodes 1 to 4 will now be analysed to delineate why the striking of an energy particle may not affect the first stage circuit 402 to cause an error at the output Q.

At Node 1, any energized particle hitting either the drain (D) terminals of the NMOS transistors T3 or T5 may create a negative SET pulse, driving GND to a lower voltage level. This may continue turning off the NMOS transistor T7, and, hence no error.

At Node 2, there are two cases, hitting either at the source (S) terminal of the NMOS transistor T3 or at the drain (D) terminal of the PMOS transistor T1. In the former case, the effect is the same as that described above in relation to Node 1, where the voltage of Node 1 may be lower (via the NMOS transistor T3 as the resistive path). Put simply, no error may appear at Q. In the latter situation, because the affected transistor is a PMOS transistor, a positive SET pulse may result, hence, possibly charging the voltage level of Node 2 and then of Node 1 (via the resistive path). However, the resistive path of the NMOS transistor T3 may take time for delay propagation. Such delay may be able to serve as a time filter to attenuate the pulse transferred over to Node 1. Further, there may be a $V_{TN}$ drop over the NMOS transistor T3 (where $V_{TN}$ is the threshold voltage of NMOS transistor T3), restricting Node 1 to be fully charged. The amount of voltage attenuation may further be controlled through the sizing of the NMOS transistor T3. Yet further, the NMOS transistor T5 is on, helping to maintain the voltage level of GND for Node 1. Therefore, as a result of one or more of the above-mentioned effects, the voltage increase (through charging) at Node 2 is unlikely to cause a large voltage increase at Node 1, hence, an output error is unlikely.

At Node 3, any energized particle hitting either the drain (D) terminals of the PMOS transistors T2 or T6 may create a positive SET pulse, driving $V_{TP}$ to a higher voltage level (e.g., $V_{DD}$) and then possibly temporarily turning off the PMOS transistor T7. However, the positive SET pulse is very short (e.g., <250 ps), hence, the PMOS transistor T7 may be turned on again thereafter. As the NMOS transistor T8 remains off (during the transient), Q may never be discharged and remains as '1', and, hence no error.

At Node 4, there are two cases, hitting either at the source (S) terminal of the PMOS transistor T6 or at the drain (D) terminal of the NMOS transistor T4. In the former case, the effect is the same as that described above in relation to Node 3, where the voltage of Node 3 may be higher (via the PMOS transistor T6 as the resistive path). Put simply, no error may appear at Q. In the latter situation, because the affected transistor is an NMOS transistor, a negative SET pulse may result, hence further discharging the voltage level of Node 4 and then of Node 3 (via the resistive path) to be even lower. This may continue turning on the PMOS transistor T7, and, hence no error.

Having analysed Nodes 1 to 4, any SETs (if induced) in the first stage circuit 402 may be unlikely to cause an error in the second stage circuit 404, and, hence, the first stage circuit 402 may be virtually SET-tolerant even at a high LET level. The second stage circuit 404 may have a cross section that may be susceptible to SET but may be designed to be SET-tolerant by RHBD means—this is relatively inexpensive as this second stage circuit 404 may simply be an inverter.

Various circuit arrangements or digital gates may similarly be designed in accordance with the techniques disclosed herein. Non-limiting examples are further described below, with reference to FIGS. 5, 6A to 6E, 7A to 7F, and 8.

Figure 5:
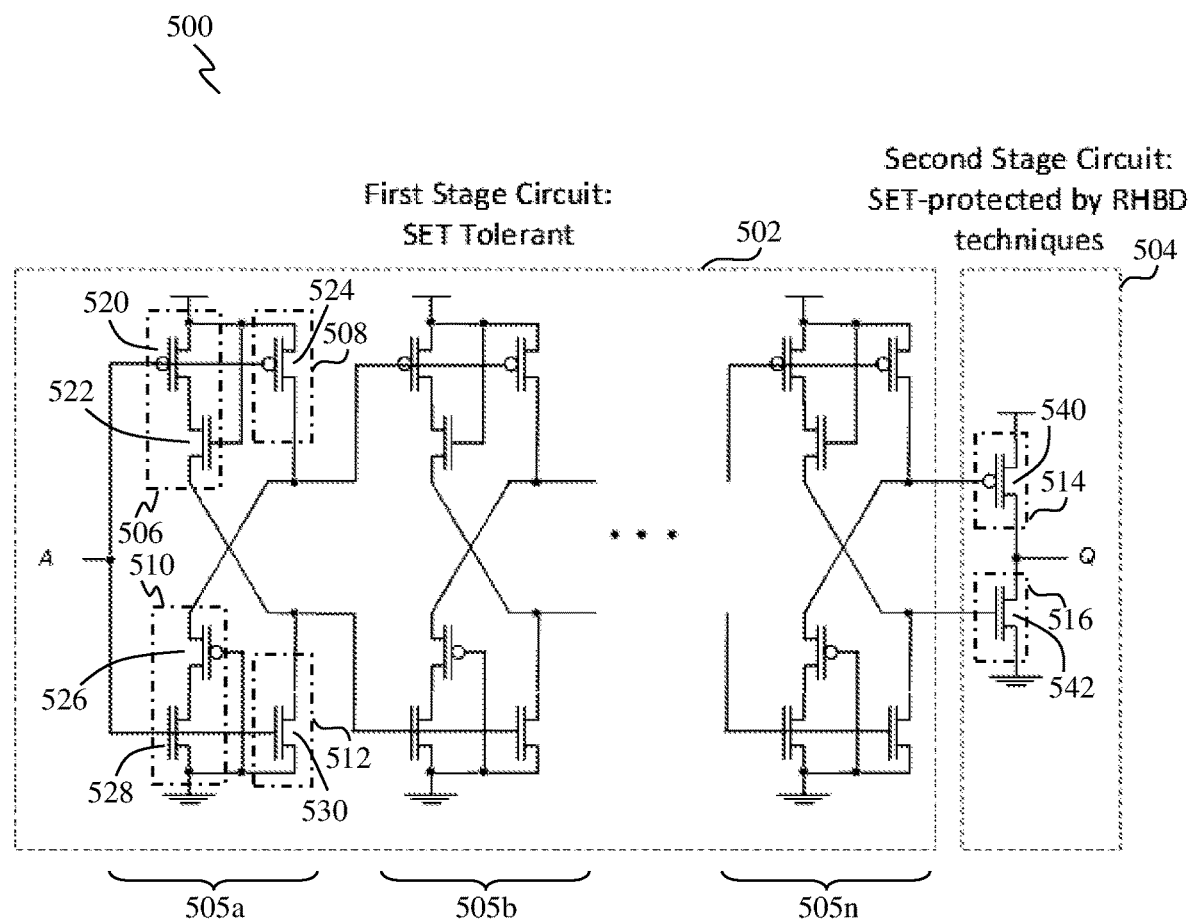
FIG. 5 shows a schematic diagram of a circuit arrangement, according to various embodiments.

FIG. 5 shows a schematic diagram of a circuit arrangement 500, according to various embodiments, illustrating a delay line circuit arrangement. The delay line circuit arrangement 500 may receive an input signal A, and provide an output signal Q. The circuit arrangement 500 may include a first stage circuit 502 and a second stage circuit 504 connected or electrically coupled to each other. The first stage circuit 502 may be virtually SET tolerant, while the second stage circuit 504 may be protected by RHBD practices such as transistor up-sizing, and/or layout techniques.

The first stage circuit 502 may have multiple cascading split-inverters, and is virtually SET-tolerant. The first stage circuit 502 may include a plurality of cascading or successive sub-circuits (or cascading split-inverters), with the first two cascading sub-circuits 505a, 505b and the last cascading sub-circuit 505n illustrated in FIG. 5. The plurality of cascading sub-circuits 505a, 505b, 505n may be connected or electrically coupled to one another, where a succeeding sub-circuit (e.g., 505b) may receive or act on an output of a preceding sub-circuit (e.g., 505a). Using the front cascading sub-circuit 505a as a non-limiting example, with the following description also applicable to any of the other cascading sub-circuits, the front cascading sub-circuit 505a may include, similar to the circuit arrangement 400, a pull-up network 506 having a PMOS transistor 520 and an NMOS transistor 522, an auxiliary pull-up network 508 having a PMOS transistor 524, a pull-down network 510 having a PMOS transistor 526 and an NMOS transistor 528, and an auxiliary pull-down network 512 having an NMOS transistor 530.

Similar to the circuit arrangement 400, the second stage circuit 504 may include a pull-up network 514 and a pull-down network 516 connected or electrically coupled to each other. The pull-up network 514 may include a PMOS transistor 540, while the pull-down network 516 may include an NMOS transistor 542. The PMOS transistor 540 and the NMOS transistor 542 may together define an inverter.

The first stage circuit 502 and the second stage circuit 504, including their corresponding networks, transistors and connections, may be as described in the context of the circuit arrangement 400, but with some modifications as will be described below.

The gate (G) terminals of the transistors 520, 524, 528, 530 of the front cascading sub-circuit 505a may receive the input signal A. The drain (D) terminals of the PMOS transistor (e.g., 524) of the auxiliary pull-up network (e.g., 508) and the PMOS transistor (e.g., 526) of the pull-down network (e.g., 510) of the preceding sub-circuit (e.g., 505a) may be connected to gate (G) terminals of the PMOS transistors of the pull-up network and the auxiliary pull-up network of the succeeding sub-circuit (e.g., 505b). The drain (D) terminals of the NMOS transistor (e.g., 522) of the pull-up network (e.g., 506) and the NMOS transistor (e.g., 530) of the auxiliary pull-down network (e.g., 512) of the preceding sub-circuit (e.g., 505a) may be connected to gate (G) terminals of the NMOS transistors of the pull-down network and the auxiliary pull-down network of the succeeding sub-circuit (e.g., 505b). The drain (D) terminals of the PMOS transistors of the auxiliary pull-up network and the pull-down network of the last cascading sub-circuit (e.g., 505n) are connected to the gate (G) terminal of the PMOS transistor 540 of the pull-up network 514 of the second stage circuit 504. The drain (D) terminals of the NMOS transistors of the pull-up network and the auxiliary pull-down network of the last cascading sub-circuit (e.g., 505n) are connected to the gate (G) terminal of the NMOS transistor 542 of the pull-down network 516 of the second stage circuit 504.

The circuit arrangement 500 functions as a delay line whose delay is accumulated over the multiple split-inverters, from the front cascading sub-circuit 505a to the last cascading sub-circuit 505n, and to the second stage circuit 504. For illustration, consider the case when the input signal A is changed from logic 'low' to logic 'high'. In this case, for the front cascading sub-circuit 505a, when its input (i.e., the input signal A) changes, the output of the associated pull-down network 510 (and the output of the associated auxiliary pull-up network 508) may be discharged to $V_{TP}$ (as logic 'low' although there is a threshold voltage difference), and the output of the associated auxiliary pull-down network 512 (and the output of the associated pull-up network 506) may be discharged to GND (as logic 'low'). These discharging processes take some time to trigger the succeeding sub-circuit 505b. For the succeeding or intermediate sub-circuit 505b, when its inputs (i.e., the outputs of the front cascading sub-circuit 505a) change, the output of the associated pull-up network (and the output of the associated auxiliary pull-down network) may be charged to $V_{DD}-V_{TN}$ (as logic 'high' although there is a threshold voltage difference), and the output of the associated auxiliary pull-up network (and the output of the associated pull-down network) may be charged to $V_{DD}$. These charging processes take some time to trigger another succeeding sub-circuit. The discharging and charging processes take place alternately within the cascading sub-circuits (i.e., from 505a, 505b, . . . to 505n). For the second stage circuit 504, when its inputs (i.e., the outputs of the last cascading sub-circuit 505n) change, the output Q may be discharged to GND (if the number of all the cascading sub-circuits is even), or may be charged to $V_{DD}$ (if the number for all the cascading sub-circuits is odd). For another case when the input signal A charges from logic 'high' to logic 'low', the similar charging and discharging processes take place alternately within the cascading sub-circuits, and to the second stage circuit 504. For the second stage circuit 504, when its inputs (i.e., the outputs of the last cascading sub-circuit 505n) change, the output Q may be discharged to $V_{DD}$ (if the number of all the cascading sub-circuits is even), or may be charged to GND (if the number for all the cascading sub-circuits is odd). The final delay is the propagation delay between the duration from the input signal A changes until the output signal Q changes.

If there are N split-inverters (or cascading sub-circuits), the error-rate may be reduced by 1/(N+1) compared to the design with known RHBD up-sizing. A potential application is to realise a local clock generator. If there are 1000 thousand inverters provided in the local generator, the error-rate reduction may be up to 3 orders of magnitude (1000×).

Figure 6A:
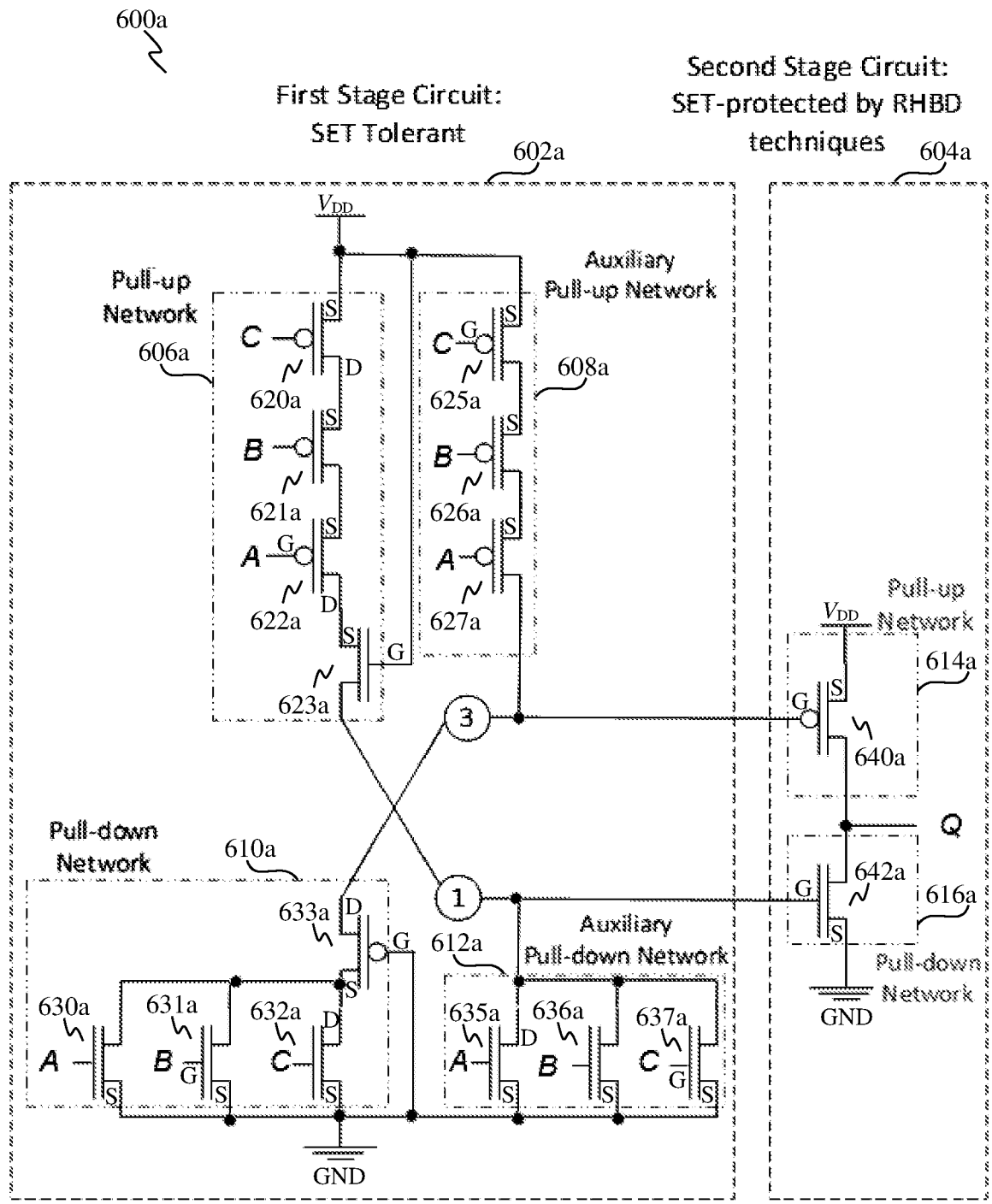
FIGS. 6A to 6E show schematic diagrams of circuit arrangements, according to various embodiments.

Various embodiments may also provide multi-input circuit arrangements, e.g., multi-input digital gates. FIG. 6A shows a schematic diagram of a circuit arrangement 600a, according to various embodiments, illustrating a 3-input OR gate design.

The circuit arrangement 600a may receive three primary inputs A, B, C and provide a primary output Q. Similar to the circuit arrangement 400 (FIGS. 4A to 4C), the circuit arrangement 600a may include a first stage circuit 602a that may be virtually SET tolerant, and a second stage circuit 604a, connected or electrically coupled to the first stage circuit 602a, that may be protected by RHBD techniques. While the first stage circuit 602a is comparatively more complex, the transistors in the first stage circuit 602a may be sized close to the minimum sizing with minimal or without challenges of SET errors.

The first stage circuit 602a may include a pull-up network 606a and an auxiliary pull-up network 608a connected or electrically coupled to each other, and a pull-down network 610a and an auxiliary pull-down network 612a connected or electrically coupled to each other. The pull-up network 606a may include a plurality of stacking PMOS transistors 620a, 621a, 622a, where adjacent transistors are connected drain (D) terminal-to-source (S) terminal, and an NMOS transistor 623a. The transistors 622a, 623a may be connected drain (D) terminal-to-source (S) terminal. The auxiliary pull-up network 608a may include a plurality of stacking PMOS transistors 625a, 626a, 627a, where adjacent transistors are connected drain (D) terminal-to-source (S) terminal. The source (S) terminals of the PMOS transistors 620a, 625a and the gate (G) terminal of the NMOS transistor 623a may be connected to a power supply (e.g., $V_{DD}$). The pull-down network 610a may include a plurality of NMOS transistors 630a, 631a, 632a connected in parallel to each other, and a PMOS transistor 633a. The drain (D) terminals of the NMOS transistors 630a, 631a, 632a may be connected to the source (S) terminal of the PMOS transistor 633a. The auxiliary pull-down network 612a may include a plurality of NMOS transistors 635a, 636a, 637a connected in parallel to each other. The source (S) of the NMOS transistors 630a, 631a, 632a, 635a, 636a, 637a and the gate (G) terminal of the PMOS transistor 633a may be connected to ground (e.g., GND). Nodes 1 and 3 (identified by the respective numbers within circles in FIG. 6A) are illustrated in the first stage circuit 602a, similar to that of the first stage circuit 402 of the circuit arrangement 400 (FIGS. 4A to 4C).

The second stage circuit 604a may be electrically coupled to the first stage circuit 602a, and may include a pull-up network 614a and a pull-down network 616a connected or electrically coupled to each other. The pull-up network 614a may include a PMOS transistor 640a, while the pull-down network 616a may include an NMOS transistor 642a. The transistors 640a, 642a may together define an inverter. The gate (G) terminal of the PMOS transistor 640a may be connected to the drain (D) terminals of the PMOS transistors 627a, 633a. The gate (G) terminal of the NMOS transistor 642a may be connected to the drain (D) terminals of the NMOS transistors 623a, 635a, 636a, 637a. The source (S) terminal of the PMOS transistor 640a may be connected to a power supply (e.g., $V_{DD}$), while the source (S) terminal of the NMOS transistor 642a may be connected to ground (e.g., GND). The drain (D) terminal of the transistors 640a, 642a may be connected to each other and from which the output signal Q may be outputted.

The circuit arrangement 600a may be as described in the context of the circuit arrangement 400, but with some modifications. As may be appreciated, the pull-up network 606a may include stacking PMOS transistors 620a, 621a, 622a, the auxiliary pull-up network 608a may include stacking PMOS transistors 625a, 626a, 627a, the pull-down network 610a may include parallelly connected NMOS transistors 630a, 631a, 632a, and the auxiliary pull-down network 612a may include parallelly connected NMOS transistors 635a, 636a, 637a, as compared to the circuit arrangement 400 having corresponding one transistor in each of the respective corresponding networks. A first input signal A may be supplied to the gate (G) terminals of the transistors 622a, 627a, 630a, 635a, a second input signal B may be supplied to the gate (G) terminals of the transistors 621a, 626a, 631a, 636a, while a third input signal C may be supplied to the gate (G) terminals of the transistors 620a, 625a, 632a, 637a. However, it should be appreciated that respective input signals may be provided to the gate (G) terminal of a different transistor, and/or that there may be a different number of input signals.

The circuit arrangement 600a functions as an OR gate. For illustration, consider the case when the input signals A, B and C are all 'low', the output of the pull-up network 606a (and the output of the auxiliary pull-down network 612a) may be charged to $V_{DD}-V_{TP}$ (as logic 'high' although there is a threshold voltage difference), and the output of the auxiliary pull-up network 608a (and the output of the pull-down network 610a) may be charged to $V_{DD}$ (as logic 'high'). These charging processes may trigger the second stage circuit 604a to generate a 'low' output. Consider another case when at least one of the input signals A, B and C is 'high', the output of the pull-down network 610a (and the output of the auxiliary pull-up network 608a) may be discharged to $V_{TN}$ (as logic 'low' although there is a threshold voltage difference), and the output of the auxiliary pull-down network 612a (and the output of the pull-up network 606a) may be discharged to GND (as logic 'low'). These discharging processes may trigger the second stage circuit 604a to generate a 'high' output.

While known OR gates may have only 6 transistors, these transistors need to be sized very large in order to mitigate SETs. Such large transistors usually lead to large cross-section and possibly a higher error-rate. Overall, known OR gates would have a higher error-rate than the OR gates according to various embodiments, as will be described further below. It should be appreciated that various circuit arrangements in the form of multi-input gates having a 2-stage structure (such as OR, MUX, XOR, XNOR and others) may be similarly realised according to the techniques disclosed herein.

Figure 6B:
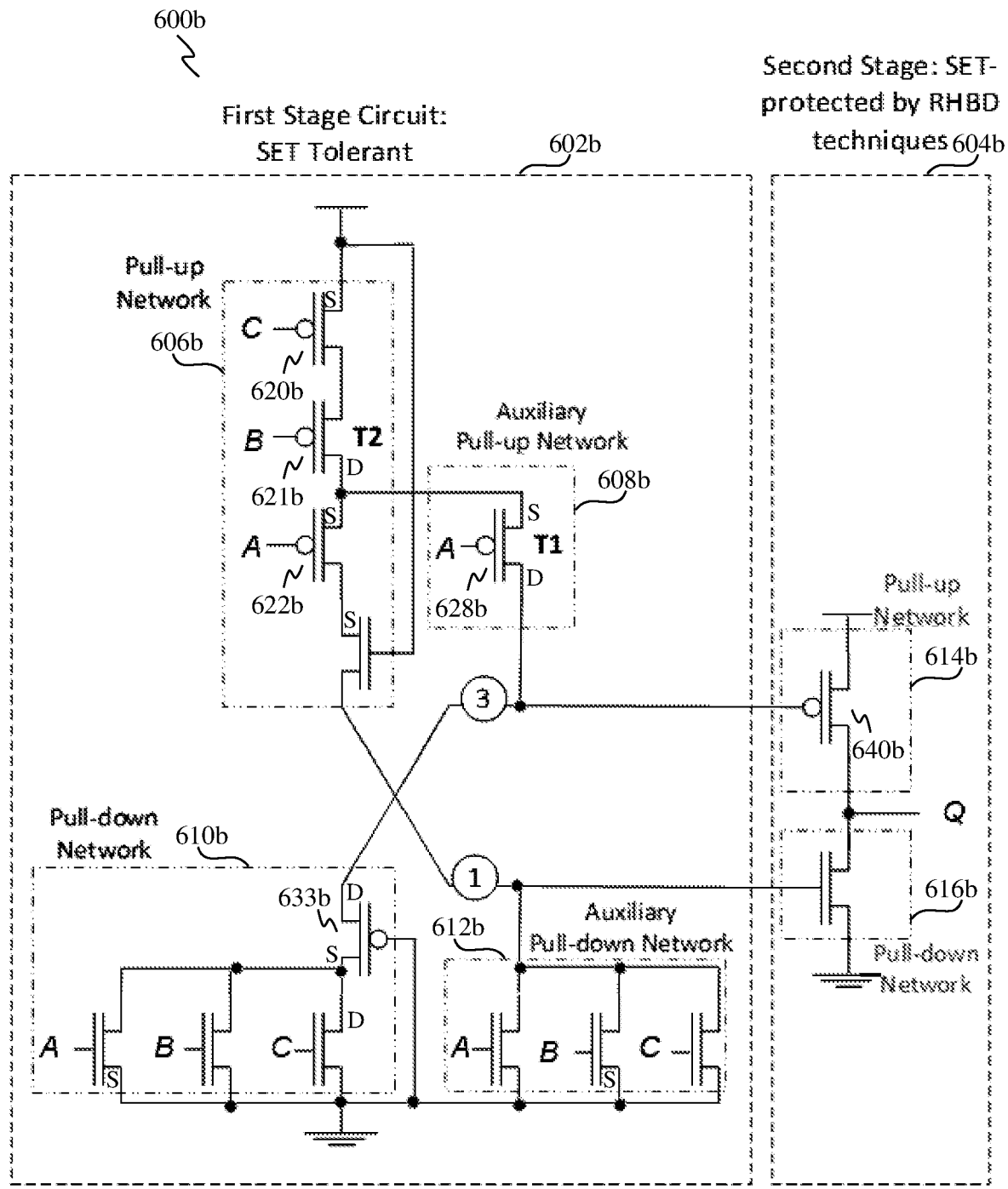

FIG. 6B shows a schematic diagram of a circuit arrangement 600b, according to various embodiments, illustrating another 3-input OR gate design. The circuit arrangement 600b may include a first stage circuit 602b that may be virtually SET tolerant, and a second stage circuit 604b, connected or electrically coupled to the first stage circuit 602b, that may be protected by RHBD techniques.

The first stage circuit 602b may include a pull-up network 606b, an auxiliary pull-up network 608b, a pull-down network 610b and an auxiliary pull-down network 612b. The second stage circuit 604b may include a pull-up network 614b and a pull-down network 616b. The first stage circuit 602b and the second stage circuit 604b may be electrically coupled to each other. The first stage circuit 602b and the second stage circuit 604b, including their corresponding networks, transistors and connections, may be as described in the context of the circuit arrangement 600a, except that, instead of using three series transistors to hold the voltage level at Node 3, the auxiliary pull-up network 608b may include just one PMOS transistor (T1) 628b, where the source (S) terminal of the PMOS transistor 628b may be connected to the drain (D) terminal of the PMOS transistor (T2) 621b. The source (S) terminal of the PMOS transistor 628b may also be connected to the source (S) terminal of the PMOS transistor 622b. The drain (D) terminal of the PMOS transistor 628b may be connected to the drain (D) terminal of the PMOS transistor 633b and the gate (G) terminal of the PMOS transistor 640b. An input signal A may be supplied to the gate (G) terminal of the PMOS transistor 628b.

The circuit arrangement 600b enables a saving of two transistors with very small compromises to the soft error-rate. Compared to the circuit arrangement 600a (FIG. 6A), the circuit arrangement 600b has slightly improved area (i.e., less area) and improved (i.e., lower) power.

The circuit arrangement 600b functions as an OR gate. For illustration, consider the case when the input signals A, B and C are all 'low', the output of the pull-up network 606b (and the output of the auxiliary pull-down network 612b) may be charged to $V_{DD}-V_{TP}$ (as logic 'high' although there is a threshold voltage difference), and the output of the auxiliary pull-up network 608b (and the output of the pull-down network 610b) may be charged to $V_{DD}$ (as logic 'high'). The auxiliary pull-up network 608b shares the charging path via transistors 621b and 620b in the pull-up network 606b. These charging processes may trigger the second stage circuit 604b to generate a 'low' output. Consider another case when at least one of the input signals A, B and C is 'high', the output of the pull-down network 610b (and the output of the auxiliary pull-up network 608b) may be discharged to $V_{TN}$ (as logic 'low' although there is a threshold voltage difference), and the output of the auxiliary pull-down network 612b (and the output of the pull-up network 606b) may be discharged to GND (as logic 'low'). These discharging processes may trigger the second stage circuit 604b to generate a 'high' output.

Figure 6C:
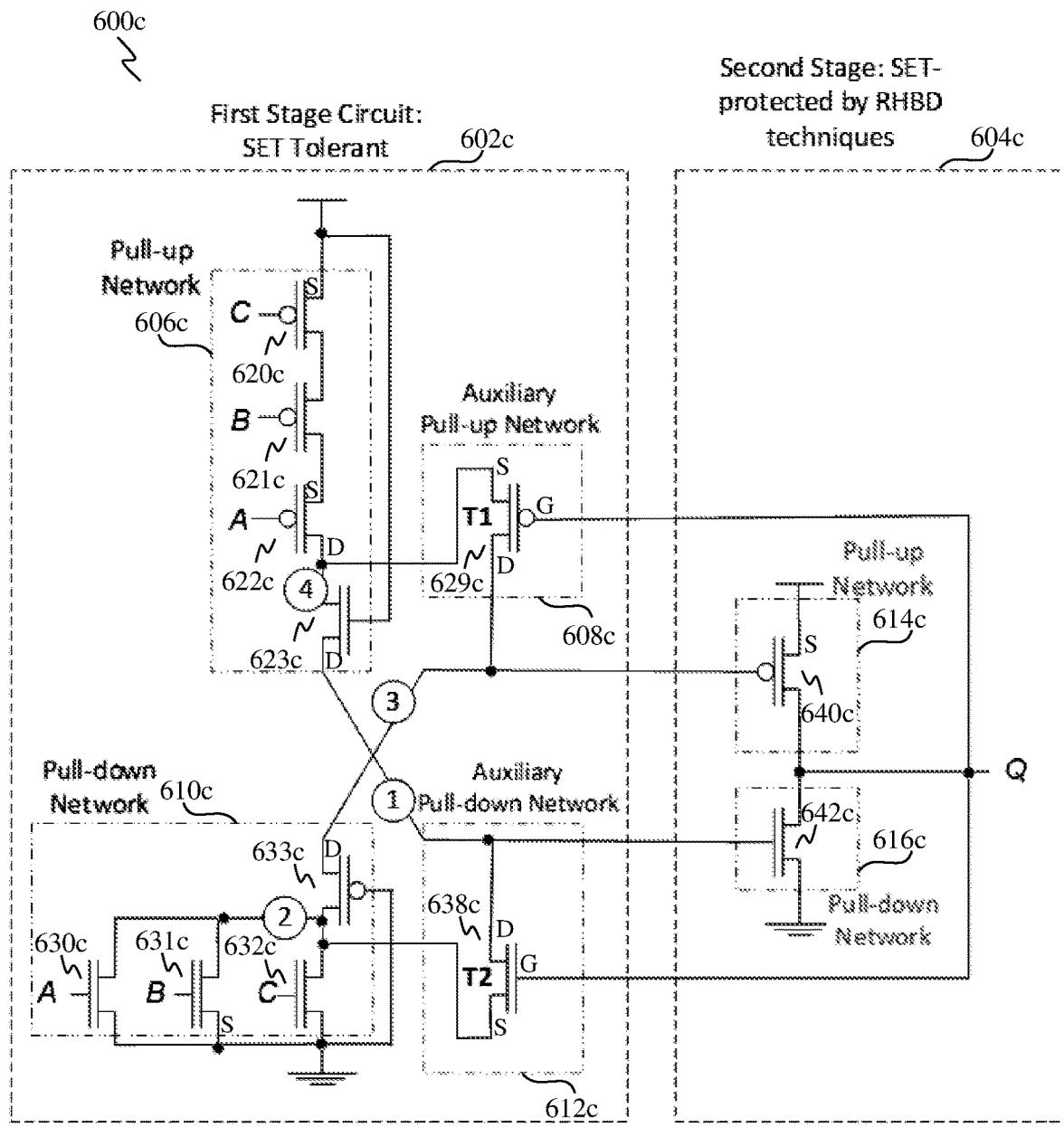

FIG. 6C shows a schematic diagram of a circuit arrangement 600c, according to various embodiments, illustrating a further 3-input OR gate design. The circuit arrangement 600c may include a first stage circuit 602c that may be virtually SET tolerant, and a second stage circuit 604c, connected or electrically coupled to the first stage circuit 602c, that may be protected by RHBD techniques.

The first stage circuit 602c may include a pull-up network 606c, an auxiliary pull-up network 608c, a pull-down network 610c and an auxiliary pull-down network 612c. The second stage circuit 604c may include a pull-up network 614c and a pull-down network 616c. The first stage circuit 602c and the second stage circuit 604c may be electrically coupled to each other. The circuit arrangement 600c may be optimised, for example, by having one (single) transistor in each of the auxiliary pull-up network 608c and the auxiliary pull-down network 612c.

The first stage circuit 602c and the second stage circuit 604c, including their corresponding networks, transistors and connections, may be as described in the context of the circuit arrangement 600a, except that a feedback PMOS transistor (T1) 629c is used in the auxiliary pull-up network 608c, and a feedback NMOS transistor (T2) 638c is used in the auxiliary pull-down network 612c. The feedback PMOS transistor 629c has its source (S) terminal connected to Node 4, and its gate (G) terminal connected to the drain (D) terminals of the PMOS transistor 640c and the NMOS transistor 642c, or to the output node, for receiving the output signal Q, so as to maintain the voltage level at Node 3. The drain (D) terminal of the feedback PMOS transistor 629c may be connected to the drain (D) terminal of the PMOS transistor 633c and the gate (G) terminal of the PMOS transistor 640c. The feedback NMOS transistor 638c has its source (S) terminal connected to Node 2, and its gate (G) terminal connected to the drain (D) terminals of the PMOS transistor 640c and the NMOS transistor 642c, or to the output node, for receiving the output signal Q, so as to maintain the voltage level at Node 1. The drain (D) terminal of the feedback NMOS transistor 638c may be connected to the drain (D) terminal of the NMOS transistor 623c and the gate (G) terminal of the NMOS transistor 642c.

The circuit arrangement 600c enables a saving of four transistors with very small compromises to the soft error-rate. Compared to the circuit arrangement 600a (FIG. 6A), the circuit arrangement 600c has slightly improved area (i.e., less area) and improved (i.e., lower) power.

The circuit arrangement 600c functions as an OR gate. For illustration, consider the case when the input signals A, B and C are all 'low', the output of the pull-up network 606c (and the output of the auxiliary pull-down network 612c) may be charged to $V_{DD}-V_{TP}$ (as logic 'high' although there is a threshold voltage difference). This charging process may trigger the second stage circuit 604c to generate a 'low' output which may trigger the output of the auxiliary pull-up network 608c (and the output of the pull-down network 610c) to be charged to $V_{DD}$ (as logic 'high'); the auxiliary pull-up network 608c shares the charging path via transistors 622c, 621c and 620c in the pull-up network 606c. Consider another case when at least one of the input signals A, B and C is 'high', the output of the pull-down network 610c (and the output of the auxiliary pull-up network 608c) may be discharged to $V_{TN}$ (as logic 'low' although there is a threshold voltage difference). This discharging process may trigger the second stage circuit 604c to generate a 'high' output which may trigger the output of the auxiliary pull-down network 612c (and the output of the pull-up network 606c) to be charged to GND (as logic low'). The auxiliary pull-down network 612c shares the discharging path via transistors 632c, 631c and 630c in the pull-down network 610c.

Figure 6D:
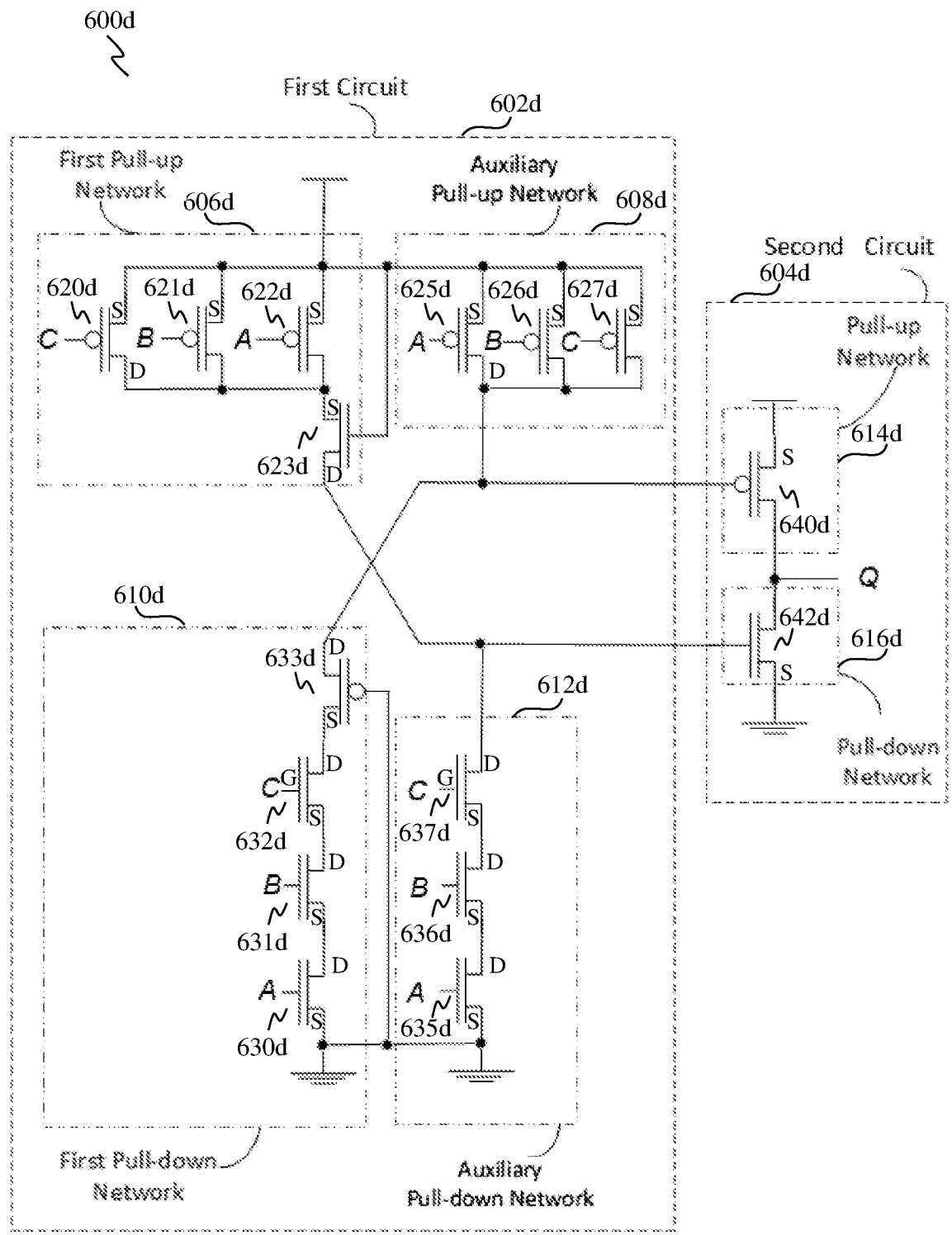

FIG. 6D shows a schematic diagram of a circuit arrangement 600d, according to various embodiments, illustrating a 3-input AND gate design. The circuit arrangement 600b may receive three primary inputs A, B, C and provide a primary output Q. The circuit arrangement 600d may include a first stage circuit 602d that may be virtually SET tolerant, and a second stage circuit 604d, connected or electrically coupled to the first stage circuit 602d, that may be protected by RHBD techniques.

The first stage circuit 602d may include a pull-up network 606d and an auxiliary pull-up network 608d connected or electrically coupled to each other, and a pull-down network 610d and an auxiliary pull-down network 612d connected or electrically coupled to each other. The second stage circuit 604d may include a pull-up network 614d and a pull-down network 616d connected or electrically coupled to each other. The first stage circuit 602d and the second stage circuit 604d may be electrically coupled to each other.

The pull-up network 606d may include a plurality of PMOS transistors 620d, 621d, 622d connected in parallel to each other, and an NMOS transistor 623d. The drain (D) terminals of the PMOS transistors 620d, 621d, 622d may be connected to the source (S) terminal of the NMOS transistor 623d. The auxiliary pull-up network 608d may include a plurality of PMOS transistors 625d, 626d, 627d connected in parallel to each other. The source (S) of the PMOS transistors 620d, 621d, 622d, 625d, 626d, 627d and the gate (G) terminal of the NMOS transistor 623d may be connected to a power supply (e.g., $V_{DD}$). The pull-down network 610d may include a plurality of stacking NMOS transistors 630d, 631d, 632d, where adjacent transistors are connected drain (D) terminal-to-source (S) terminal, and a PMOS transistor 633d. The transistors 632d, 633d may be connected drain (D) terminal-to-source (S) terminal. The auxiliary pull-down network 612d may include a plurality of stacking NMOS transistors 635d, 636d, 637d, where adjacent transistors are connected drain (D) terminal-to-source (S) terminal. The source (S) terminals of the NMOS transistors 630d, 635d and the gate (G) terminal of the PMOS transistor 633d may be connected to ground (e.g., GND).

In the second stage circuit 604d, the pull-up network 614d may include a PMOS transistor 640d, while the pull-down network 616d may include an NMOS transistor 642d. The transistors 640d, 642d may together define an inverter. The gate (G) terminal of the PMOS transistor 640d may be connected to the drain (D) terminals of the PMOS transistors 625d, 626d, 627d, 633d. The gate (G) terminal of the NMOS transistor 642d may be connected to the drain (D) terminals of the NMOS transistors 623d, 637d. The source (S) terminal of the PMOS transistor 640d may be connected to a power supply (e.g., $V_{DD}$), while the source (S) terminal of the NMOS transistor 642d may be connected to ground (e.g., GND). The drain (D) terminals of the transistors 640d, 642d may be connected to each other and from which the output signal Q may be outputted.

The transistor connection types or layouts (i.e., stacking connection or parallel connection) in the pull-up network 606d, auxiliary pull-up network 608d, pull-down network 610d and auxiliary pull-down network 612d are exchanged as compared to the corresponding networks of the circuit arrangement 600a (FIG. 6A).

While it is illustrated in FIG. 6D that a first input signal A may be supplied to the gate (G) terminals of the transistors 622d, 625d, 630d, 635d, a second input signal B may be supplied to the gate (G) terminals of the transistors 621d, 626d, 631d, 636d, a third input signal C may be supplied to the gate (G) terminals of the transistors 620d, 627d, 632d, 637d, it should be appreciated that respective input signals may be provided to the gate (G) terminal of a different transistor, and/or that there may be a different number of input signals.

The circuit arrangement 600d functions as an AND gate. For illustration, consider the case when at least one of the input signals A, B and C is 'low', the output of the pull-up network 606d (and the output of the auxiliary pull-down network 612d) may be charged to $V_{DD}-V_{TP}$ (as logic 'high' although there is a threshold voltage difference), and the output of the auxiliary pull-up network 608d (and the output of the pull-down network 610d) may be charged to $V_{DD}$ (as logic 'high'). These charging processes may trigger the second stage circuit 604d to generate a 'low' output. Consider another case when all the input signals A, B and C are 'high', the output of the pull-down network 610d (and the output of the auxiliary pull-up network 608d) may be discharged to $V_{TN}$ (as logic 'low' although there is a threshold voltage difference), and the output of the auxiliary pull-down network 612d (and the output of the pull-up network 606d) may be discharged to GND (as logic 'low'). These discharging processes may trigger the second stage circuit 604d to generate a 'high' output.

Figure 6E:
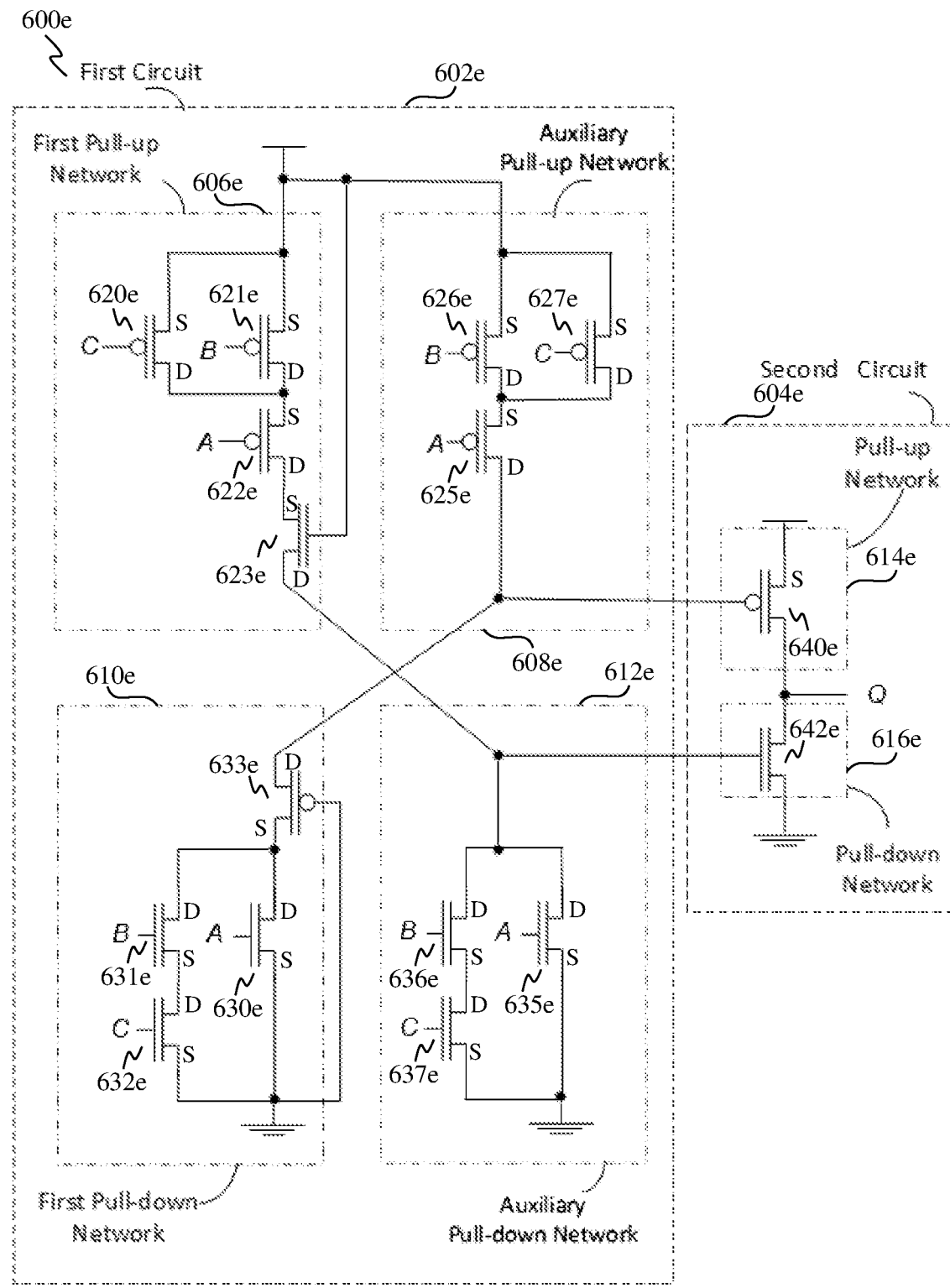

FIG. 6E shows a schematic diagram of a circuit arrangement 600e, according to various embodiments, illustrating a 3-input Complex gate (AND-OR function) design. The circuit arrangement 600e may receive three primary inputs A, B, C and provide a primary output Q. The circuit arrangement 600e may include a first stage circuit 602e that may be virtually SET tolerant, and a second stage circuit 604e, connected or electrically coupled to the first stage circuit 602e, that may be protected by RHBD techniques. The first stage circuit 602e may include a pull-up network 606e and an auxiliary pull-up network 608e connected or electrically coupled to each other, and a pull-down network 610e and an auxiliary pull-down network 612e connected or electrically coupled to each other. The second stage circuit 604e may include a pull-up network 614e and a pull-down network 616e connected or electrically coupled to each other. The first stage circuit 602e and the second stage circuit 604e may be electrically coupled to each other.

As illustrated in FIG. 6E, the plurality of transistors in each of the pull-up network 606e, auxiliary pull-up network 608e, pull-down network 610e and auxiliary pull-down network 612e may be both stacked and connected in parallel to each other.

In greater detail, the pull-up network 606e may include a plurality of PMOS transistors 620e, 621e, 622e and an NMOS transistor 623e connected or electrically coupled to each other. Each of the PMOS transistors 620e, 621e, may be arranged stacked with the PMOS transistor 622e, while the PMOS transistors 620e, 621e may be connected in parallel to each other. The drain (D) terminal of the PMOS transistor 622e may be connected to the source (S) terminal of the NMOS transistor 623e. The auxiliary pull-up network 608e may include a plurality of PMOS transistors 625e, 626e, 627e connected or electrically coupled to each other. Each of the PMOS transistors 626e, 627e, may be arranged stacked with the PMOS transistor 625e, while the PMOS transistors 626e, 627e may be connected in parallel to each other. The source (S) of the PMOS transistors 620e, 621e, 626e, 627e and the gate (G) terminal of the NMOS transistor 623e may be connected to a power supply (e.g., $V_{DD}$). The pull-down network 610e may include a plurality of NMOS transistors 630e, 631e, 632e and a PMOS transistor 633e connected or electrically coupled to each other. The NMOS transistors 631e, 632e may form stacking transistors, and collectively connected in parallel with the NMOS transistor 630e. The source (S) terminal of the PMOS transistor 633e may be connected to the drain (D) terminals of the NMOS transistors 630e, 631e. The auxiliary pull-down network 612e may include a plurality of NMOS transistors 635e, 636e, 637e connected or electrically coupled to each other. The NMOS transistors 636e, 637e may form stacking transistors, and collectively connected in parallel with the NMOS transistor 635e. The source (S) terminals of the NMOS transistors 630e, 632e, 635d, 637e and the gate (G) terminal of the PMOS transistor 633e may be connected to ground (e.g., GND).

In the second stage circuit 604e, the pull-up network 614e may include a PMOS transistor 640e, while the pull-down network 616e may include an NMOS transistor 642e. The transistors 640e, 642e may together define an inverter. The gate (G) terminal of the PMOS transistor 640e may be connected to the drain (D) terminals of the PMOS transistors 625e, 633e. The gate (G) terminal of the NMOS transistor 642e may be connected to the drain (D) terminals of the NMOS transistors 623e, 635e, 636e. The source (S) terminal of the PMOS transistor 640e may be connected to a power supply (e.g., $V_{DD}$), while the source (S) terminal of the NMOS transistor 642e may be connected to ground (e.g., GND). The drain (D) terminals of the transistors 640e, 642e may be connected to each other and from which the output signal Q may be outputted.

While it is illustrated in FIG. 6E that a first input signal A may be supplied to the gate (G) terminals of the transistors 622e, 625e, 630e, 635e, a second input signal B may be supplied to the gate (G) terminals of the transistors 621e, 626e, 631e, 636e, a third input signal C may be supplied to the gate (G) terminals of the transistors 620e, 627e, 632e, 637e, it should be appreciated that respective input signals may be provided to the gate (G) terminal of a different transistor, and/or that there may be a different number of input signals.

The circuit arrangement 600e functions as an AND-OR gate. For illustration, consider the case when the input signal A is 'low' and at least one of the input signals B and C is 'low', the output of the pull-up network 606e (and the output of the auxiliary pull-down network 612e) may be charged to $V_{DD}-V_{TP}$ (as logic 'high' although there is a threshold voltage difference), and the output of the auxiliary pull-up network 608e (and the output of the pull-down network 610e) may be charged to $V_{DD}$ (as logic 'high'). These charging processes may trigger the second stage circuit 604e to generate a 'low' output. Consider another case when the input signal A is 'high' or the input signals B and C are both 'high', the output of the pull-down network 610e (and the output of the auxiliary pull-up network 608e) may be discharged to $V_{TN}$ (as logic low' although there is a threshold voltage difference), and the output of the auxiliary pull-down network 612e (and the output of the pull-up network 606e) may be discharged to GND (as logic 'low'). These discharging processes may trigger the second stage circuit 604e to generate a 'high' output.

It should be appreciated that, for CMOS, the PMOS and NMOS transistor configurations are generally in a parallel-series pair, as may be observed, for example, in FIGS. 6A, 6D and 6E. As non-limiting examples, such parallel-series pair arrangement may be employed in static CMOS designs.

FIGS. 7A to 7C show schematic diagrams of pull-up and auxiliary pull-up networks of first stage circuits of circuit arrangements, according to various embodiments. FIGS. 7A to 7C illustrate transistors connection optimisation between pull-up networks and the corresponding auxiliary pull-up networks of the first stage circuits. For simplicity, other parts of the circuit arrangements, including for example, pull-down networks, auxiliary pull-down networks and second stage circuits, are not shown in FIGS. 7A to 7C. Nevertheless, it should be appreciated that each combination of the pull-up network and the corresponding auxiliary pull-up network, i.e., 706a and 708a (FIG. 7A), 706b and 708b (FIG. 7B), 706c and 708c (FIG. 7C), may be used with any pull-down network and any auxiliary pull-down network described herein for a first stage circuit.

Referring to FIG. 7A illustrating a standard connection, with no optimisation, the pull-up network 706a may include a plurality of stacking PMOS transistors 720a, 721a, 722a, and an NMOS transistor 723a connected or electrically coupled to each other, while the auxiliary pull-up network 708a may include a plurality of stacking PMOS transistors 725a, 726a, 727a connected or electrically coupled to each other. The source (S) terminals of the PMOS transistors 720a, 725a may be connected or electrically coupled to each other. The pull-up network 706a and the auxiliary pull-up network 708a, with their corresponding transistors and connections, may be similar to those of the circuit arrangement 600a (FIG. 6A).

Referring to FIG. 7B illustrating a first connection optimisation with one transistor removed in the auxiliary pull-up network as compared to the design of FIG. 7A, the pull-up network 706b may include a plurality of stacking PMOS transistors 720b, 721b, 722b, and an NMOS transistor 723b connected or electrically coupled to each other, while the auxiliary pull-up network 708b may include a plurality of stacking PMOS transistors 726b, 727b connected or electrically coupled to each other. The source (S) terminals of the PMOS transistors 721a, 726a and the drain (D) terminal of the PMOS transistor 720b may be connected or electrically coupled to each other.

Referring to FIG. 7C illustrating a second connection optimisation with two transistors removed in the auxiliary pull-up network as compared to the design of FIG. 7A, the pull-up network 706c may include a plurality of stacking PMOS transistors 720c, 721c, 722c, and an NMOS transistor 723c connected or electrically coupled to each other, while the auxiliary pull-up network 708c may include a PMOS transistor 727c. The source (S) terminals of the PMOS transistors 722c, 727c and the drain (D) terminal of the PMOS transistor 721c may be connected or electrically coupled to each other. The pull-up network 706c and the auxiliary pull-up network 708c, with their corresponding transistors and connections, may be similar to those of the circuit arrangement 600b (FIG. 6B).

FIGS. 7D to 7F show schematic diagrams of pull-down and auxiliary pull-down networks of first stage circuits of circuit arrangements, according to various embodiments. FIGS. 7D to 7F illustrate transistors connection optimisation between pull-down networks and the corresponding auxiliary pull-down networks of the first stage circuits. For simplicity, other parts of the circuit arrangements, including for example, pull-up networks, auxiliary pull-up networks and second stage circuits, are not shown in FIGS. 7D to 7F. Nevertheless, it should be appreciated that each combination of the pull-down network and the corresponding auxiliary pull-down network, i.e., 710d and 712d (FIG. 7D), 710e and 712e (FIG. 7E), 706f and 708f (FIG. 7F), may be used with any pull-up network and any auxiliary pull-up network described herein for a first stage circuit.

Referring to FIG. 7D illustrating a standard connection, with no optimisation, the pull-down network 710d may include a plurality of stacking NMOS transistors 730d, 731d, 732d, and a PMOS transistor 733d connected or electrically coupled to each other, while the auxiliary pull-down network 712d may include a plurality of stacking NMOS transistors 735d, 736d, 737d connected or electrically coupled to each other. The source (S) terminals of the NMOS transistors 730d, 735d may be connected or electrically coupled to each other. The pull-down network 710d and the auxiliary pull-down network 712d, with their corresponding transistors and connections, may be similar to those of the circuit arrangement 600d (FIG. 6D).

Referring to FIG. 7E illustrating a first connection optimisation with one transistor removed in the auxiliary pull-down network as compared to the design of FIG. 7D, the pull-down network 710e may include a plurality of stacking NMOS transistors 730e, 731e, 732e, and a PMOS transistor 733e connected or electrically coupled to each other, while the auxiliary pull-down network 712e may include a plurality of stacking NMOS transistors 736e, 737e connected or electrically coupled to each other. The source (S) terminals of the NMOS transistors 731e, 736e and the drain (D) terminal of the NMOS transistor 730e may be connected or electrically coupled to each other.

Referring to FIG. 7F illustrating a second connection optimisation with two transistors removed in the auxiliary pull-down network as compared to the design of FIG. 7D, the pull-down network 710f may include a plurality of stacking NMOS transistors 730f, 731f, 732f, and a PMOS transistor 733f connected or electrically coupled to each other, while the auxiliary pull-down network 712f may include an NMOS transistor 737f. The source (S) terminals of the NMOS transistors 732f, 737f and the drain (D) terminal of the NMOS transistor 731f may be connected or electrically coupled to each other.

The circuit arrangements (e.g., digital gates) of various embodiments may provide reduced error-rates. Analysis will now be provided in relation to a number of features of the circuit arrangements for several designs, starting for a simple buffer design to more complex cell-circuits. At this outset, it should be appreciated that the effects or advantages of various embodiments may be more apparent in more complex cells or circuits.

Table 1 tabulates the normalised (with respect to the design disclosed herein) LET, power, delay, area and error-rate for simple 2-stage buffers based on the standard design (non-RHBD), known RHBD up-sizing, and designs of various embodiments (see, for example, FIGS. 4A to 4C). The actual physical values are shown in the parentheses based on the buffer design of various embodiments.

TABLE 1

Comparison of the LET, power, delay, area and error-rate for simple buffer designs employing standard (non-RHBD), known RHBD (sizing) and various embodiments

|  | LET | Power | Delay | Area | Error-Rate |
|---|---|---|---|---|---|
| Non-RHBD (Standard) | 0.3× | 0.51× | 0.58× | 0.36× | 6.7× |
| RHBD (with Sizing) | 1× | 0.76× | 0.42× | 0.94× | 2× |
| RHBD of various embodiments | 1× (10) | 1× (0.7 µW) | 1× (29.4 ps) | 1× (5.78 µm$^2$) | 1× |

From Table 1, the standard non-RHBD buffer has better power, delay and area attributes (than the RHBD designs), but it suffers from low LET (i.e., errors highly occur even due to low energized particles), and high error-rate (estimated at GEO). Although the buffer design employing the RHBD sizing is sized to have the same LET threshold as the design according to various embodiments, the latter design desirably has 2× lesser error rate. It is expected that the design of various embodiments dissipates higher power, operates slower (longer delay) and occupies a larger area. This may be because the buffer design is a very simple cell (without any stacking transistors in known designs).

Consider now more complex cells where the digital gates of various embodiments may be more advantageous for multi-input gates where stacking transistors are required. Table 2 tabulates the normalised (again with respect to the design disclosed herein) LET, power, delay, area and error-rate for 2-stage 3-input OR gates based on the standard design (non-RHBD), known RHBD up-sizing, and designs of various embodiments (see, for example, FIG. 6A). As before, the actual physical values are shown in the parentheses based on the OR gate of various embodiments.

TABLE 2

Comparison of the LET, power, delay, area and error-rate for 3-input OR designs employing standard (non-RHBD), known RHBD (sizing) and various embodiments.

| | LET | Power | Delay | Area | Error-Rate |
|---|---|---|---|---|---|
| Non-RHBD (Standard) | 0.28× | 0.3× | 0.4× | 0.35× | 215× |
| RHBD (with Sizing) | 0.93× | 0.8× | 0.34× | 1.31× | 74× |
| RHBD of various embodiments | 1× (10) | 1× (1.22 µW) | 1× (39.5 ps) | 1× (10.4 µm$^2$) | 1× |

From Table 2, as expected, the standard non-RHBD OR gate similarly has better power, delay and area attributes (than the RHBD designs), but it suffers from very significantly-higher error-rate, i.e., 215× (over two orders of magnitude) worse than the OR gate according to various embodiments. Although the buffer design employing the RHBD up-sizing is sized to have a similar LET threshold as the design of various embodiments, the latter design features very significantly 74× lesser error-rate, yet requiring a smaller area. Put simply, various embodiments may be highly advantageous for reducing error-rate and area for multi-input gates but, potentially, at some cost of slower delay (and possibly higher power).

It should be appreciated that the techniques disclosed herein may be applied to design any circuit arrangement or gate (including combinational gates or sequential logic (e.g., latches, flip-flops)) or other circuits, with modification(s) including the change of transistor insertion(s) and transistor connection without deviating from the technique that one or more NMOS transistors may be employed to enable/disable an NMOS pull-down network, and one or more PMOS transistors may be employed to enable/disable a PMOS pull-up network.

As described above, the insertion of the NMOS transistor in the pull-up network in the first stage circuit may cause a somewhat weak logic-1 voltage swing (e.g., from 0 to $V_{DD}$–$V_{TN}$). Similarly, the insertion of the PMOS transistor in the pull-down network in the first stage circuit may cause a somewhat weak logic-0 voltage swing (e.g., from $V_{DD}$ to $V_{TP}$). The non-full-voltage swing may cause the overall circuit to perform slower. Nevertheless, if the threshold voltages of the PMOS and NMOS transistors are low, the overall speed performance may be improved. In view of the above, various embodiments may provide for applications using a Fully-Depleted Silicon-on-Insulator (FDSOI) process, where the NMOS transistor in the pull-up network in the first stage circuit and the PMOS transistor in the pull-down network in the first stage circuit may be internally configured to low threshold voltages, $V_{TN}$ and $V_{TP}$, respectively, e.g. $V_{TN}$≈0.1 and $V_{TP}$≈0.1.

Figure 8:
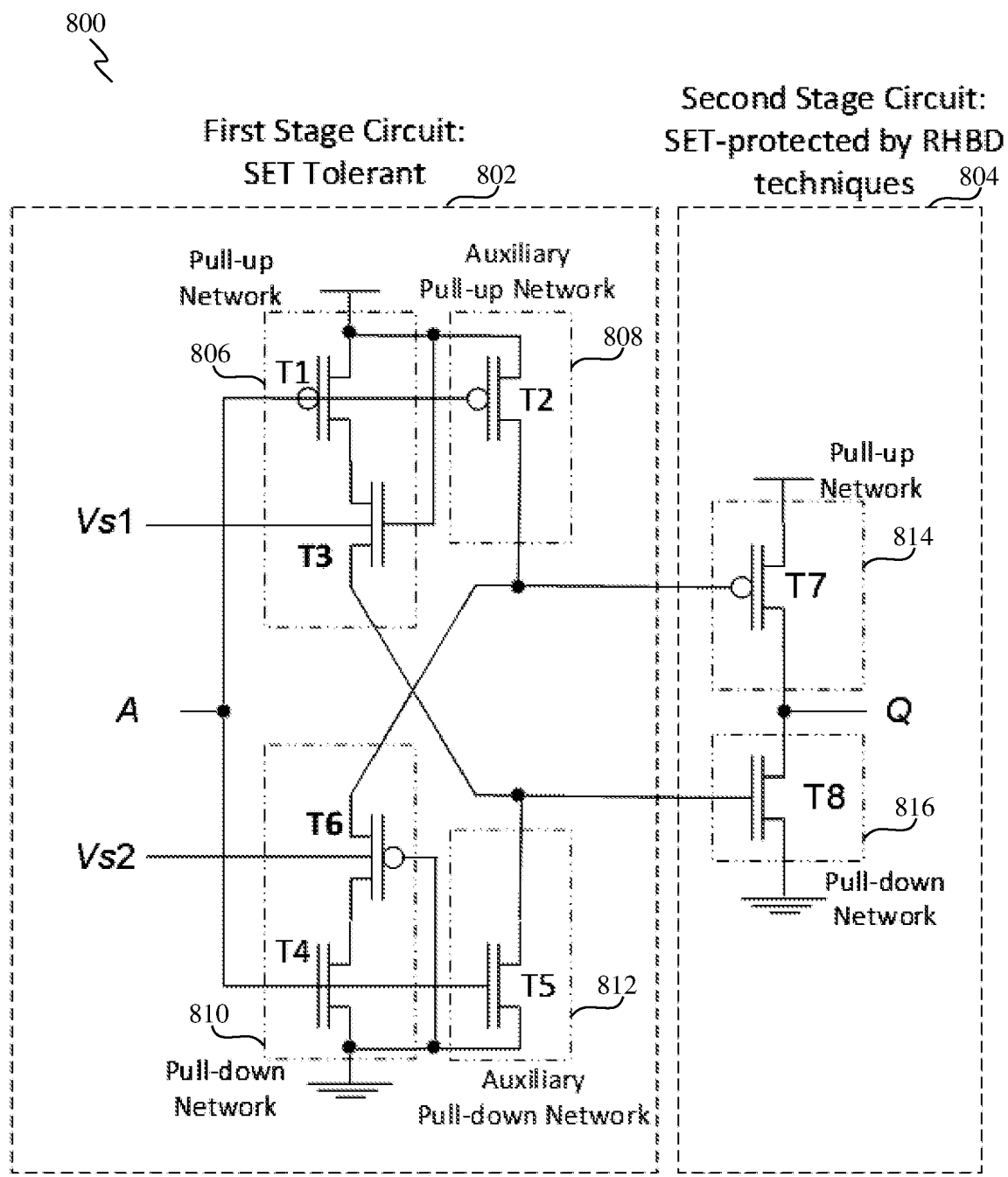
FIG. 8 shows a schematic diagram of a circuit arrangement, according to various embodiments.

FIG. 8 shows a schematic diagram of a circuit arrangement 800, according to various embodiments, illustrating a (digital) buffer gate having FDSOI transistors. The circuit arrangement 800 includes a first stage circuit 802 and a second stage circuit 804 electrically coupled to each other, where the first stage circuit 802 may include a pull-up network 806, an auxiliary pull-up network 808, a pull-down network 810, and an auxiliary pull-down network 812, while the second stage circuit 804 may include a pull-up network 814 and a pull-down network 816 connected or electrically coupled to each other. The circuit arrangement 800, including the corresponding networks, transistors and connections, may be as described in the context of the circuit arrangement 400 (FIGS. 4A to 4C) except that FDSOI transistors are used for the NMOS transistor T3 of the pull-up network 806 and for the PMOS transistor T6 of the pull-down network 810, where respective biasing or control signals, Vs1 and Vs2, may be applied to the transistors T3, T6 to control the threshold voltages, $V_{TN}$ and $V_{TP}$, of the transistors T3, T6. As a non-limiting example, the NMOS transistor T3 may be body-biased via Vs1 to reduce $V_{TN}$ of the transistor T3 itself, while the transistor T6 may similarly be body-biased via Vs2 to reduce $V_{TP}$ of the transistor T6 itself.

Various embodiments may be employed in various applications, including but not limited to circuits/systems for S&S applications and high-rel applications. For example, one possible application pertains to S&S applications. In space, radiation effects are severe, and various embodiments may help satellite applications (e.g., pico-satellites, nano-satellites, macro-satellites in Low-Earth-Orbit (LEO), and big satellites in GEO) to mitigate SEEs, hence, making these satellites more versatile and reliable, thereby extending their life-span. Another possible application pertains to automotive industry, for example, autonomous cars. For autonomous cars, particularly Level 5 autonomous vehicles, the error rate of digital circuits needs to be very low for safety concerns, where digital circuit designs according to the techniques disclosed herein may help to address this concern. A third possible application pertains to high-rel medical applications. For example, implantable electronic devices require high reliability for safety concerns, where digital circuit designs according to the techniques disclosed herein may help to address this concern. Nevertheless, it should be appreciated that the techniques disclosed herein and the various embodiments may also be employed in various other applications, including applications where reliability may be an issue.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:
1. A circuit arrangement comprising:
a first circuit configured to receive one or more input signals provided to the circuit arrangement; and
a second circuit configured to provide one or more output signals of the circuit arrangement,
wherein the first circuit comprises:
a first pull-up network comprising at least one first transistor of a first conductivity type and a second transistor of a second conductivity type electrically coupled to each other; and
a first pull-down network comprising a first transistor of the first conductivity type and at least one second transistor of the second conductivity type electrically coupled to each other, and
wherein the second circuit comprises:

a second pull-up network comprising a first transistor of the first conductivity type; and a second pull-down network comprising a second transistor of the second conductivity type, and wherein the first pull-up network and the second pull-down network are electrically coupled to each other for the second transistor of the first pull-up network to drive the second pull-down network, and wherein the first pull-down network and the second pull-up network are electrically coupled to each other for the first transistor of the first pull-down network to drive the second pull-up network.

2. The circuit arrangement as claimed in claim 1,
wherein a source terminal of the second transistor of the first pull-up network is connected to a drain terminal of the at least one first transistor of the first pull-up network,
wherein a drain terminal of the second transistor of the first pull-up network is connected to a gate terminal of the second transistor of the second pull-down network,
wherein a drain terminal of the first transistor of the first pull-down network is connected to a gate terminal of the first transistor of the second pull-up network, and
wherein a source terminal of the first transistor of the first pull-down network is connected to a drain terminal of the at least one second transistor of the first pull-down network.

3. The circuit arrangement as claimed in claim 1,
wherein, in response to a first input signal received, the first pull-up network is configured to be electrically conductive to turn on the second pull-down network to provide a first output signal, and
wherein, in response to a second input signal received, the first pull-down network is configured to be electrically conductive to turn on the second pull-up network to provide a second output signal.

4. The circuit arrangement as claimed in claim 1, further comprising:
an auxiliary pull-up network electrically coupled to the first pull-down network and the second pull-up network, the auxiliary pull-up network comprising at least one first auxiliary transistor of the first conductivity type; and
an auxiliary pull-down network electrically coupled to the first pull-up network and the second pull-down network, the auxiliary pull-down network comprising at least one second auxiliary transistor of the second conductivity type.

5. The circuit arrangement as claimed in claim 4,
wherein a drain terminal of the at least one first auxiliary transistor is connected to a drain terminal of the first transistor of the first pull-down network and to a gate terminal of the first transistor of the second pull-up network, and
wherein a drain terminal of the at least one second auxiliary transistor is connected to a drain terminal of the second transistor of the first pull-up network and to a gate terminal of the second transistor of the second pull-down network.

6. The circuit arrangement as claimed in claim 4,
wherein, in response to a first input signal received, the first pull-up network is configured to be electrically conductive to turn on the second pull-down network to provide a first output signal, and the auxiliary pull-up network is configured to be electrically conductive to turn off the second pull-up network, and wherein, in response to a second input signal received, the first pull-down network is configured to be electrically conductive to turn on the second pull-up network to provide a second output signal, and the auxiliary pull-down network is configured to be electrically conductive to turn off the second pull-down network.

7. The circuit arrangement as claimed in claim 1,
wherein the at least one first transistor of the first pull-up network comprises a plurality of first transistors of the first conductivity type, the plurality of first transistors being electrically coupled to each other and to the second transistor of the first pull-up network, and
wherein the plurality of first transistors are arranged in at least one of a stacking connection or a parallel connection.

8. The circuit arrangement as claimed in claim 1,
wherein the at least one second transistor of the first pull-down network comprises a plurality of second transistors of the second conductivity type, the plurality of second transistors being electrically coupled to each other and to the first transistor of the first pull-down network, and
wherein the plurality of second transistors are arranged in at least one of a stacking connection or a parallel connection.

9. The circuit arrangement as claimed in claim 7, further comprising:
an auxiliary pull-up network electrically coupled to the first pull-down network and the second pull-up network, the auxiliary pull-up network comprising at least one first auxiliary transistor of the first conductivity type; and
an auxiliary pull-down network electrically coupled to the first pull-up network and the second pull-down network, the auxiliary pull-down network comprising at least one second auxiliary transistor of the second conductivity type,
wherein the at least one first auxiliary transistor comprises a plurality of first auxiliary transistors of the first conductivity type, the plurality of first auxiliary transistors being electrically coupled to each other and to the first transistor of the first pull-down network, and
wherein the plurality of first auxiliary transistors are arranged in at least one of a stacking connection or a parallel connection, or
wherein a source terminal of the at least one first auxiliary transistor of the auxiliary pull-up network is connected to a source terminal of the second transistor of the first pull-up network, and wherein a gate terminal of the at least one first auxiliary transistor of the auxiliary pull-up network is connected to a drain terminal of the first transistor of the second pull-up network and to a drain terminal of the second transistor of the second pull-down network.

10. The circuit arrangement as claimed in claim 8, further comprising:
an auxiliary pull-up network electrically coupled to the first pull-down network and the second pull-up network, the auxiliary pull-up network comprising at least one first auxiliary transistor of the first conductivity type; and
an auxiliary pull-down network electrically coupled to the first pull-up network and the second pull-down network, the auxiliary pull-down network comprising at least one second auxiliary transistor of the second conductivity type, wherein the at least one second auxiliary transistor comprises a plurality of second auxiliary transistors of the second conductivity type, the plurality of second auxiliary transistors being electrically coupled to each other and to the second transistor of the first pull-up network, and wherein the plurality of second auxiliary transistors are arranged in at least one of a stacking connection or a parallel connection.

11. The circuit arrangement as claimed in claim 7, further comprising:

an auxiliary pull-up network electrically coupled to the first pull-down network and the second pull-up network, the auxiliary pull-up network comprising at least one first auxiliary transistor of the first conductivity type; and an auxiliary pull-down network electrically coupled to the first pull-up network and the second pull-down network, the auxiliary pull-down network comprising at least one second auxiliary transistor of the second conductivity type, wherein a source terminal of the at least one first auxiliary transistor of the auxiliary pull-up network is connected to a source terminal of a first transistor of the plurality of first transistors of the first pull-up network.

12. The circuit arrangement as claimed in claim 8, further comprising:

an auxiliary pull-up network electrically coupled to the first pull-down network and the second pull-up network, the auxiliary pull-up network comprising at least one first auxiliary transistor of the first conductivity type; and an auxiliary pull-down network electrically coupled to the first pull-up network and the second pull-down network, the auxiliary pull-down network comprising at least one second auxiliary transistor of the second conductivity type, wherein a source terminal of the at least one second auxiliary transistor of the auxiliary pull-down network is connected to a source terminal of a second transistor of the plurality of second transistors of the first pull-down network.

13. The circuit arrangement as claimed in claim 8, further comprising:

an auxiliary pull-up network electrically coupled to the first pull-down network and the second pull-up network, the auxiliary pull-up network comprising at least one first auxiliary transistor of the first conductivity type; and an auxiliary pull-down network electrically coupled to the first pull-up network and the second pull-down network, the auxiliary pull-down network comprising at least one second auxiliary transistor of the second conductivity type, wherein a source terminal of the at least one second auxiliary transistor of the auxiliary pull-down network is connected to a source terminal of the first transistor of the first pull-down network, and wherein a gate terminal of the at least one second auxiliary transistor of the auxiliary pull-down network is connected to a drain terminal of the first transistor of the second pull-up network and to a drain terminal of the second transistor of the second pull-down network.

14. The circuit arrangement as claimed in claim 1, wherein, for the first transistor of the first pull-down network, the first transistor is adapted for body-biasing by means of a first biasing signal applied to the first transistor to control a threshold voltage of the first transistor, or wherein, for the second transistor of the first pull-up network, the second transistor is adapted for body-biasing by means of a second biasing signal applied to the second transistor to control a threshold voltage of the second transistor.

15. The circuit arrangement as claimed in claim 1, wherein the first circuit comprises a plurality of cascading sub-circuits electrically coupled to each other, wherein each cascading sub-circuit of the plurality of cascading sub-circuits comprises:
  a pull-up network comprising at least one first transistor of a first conductivity type and a second transistor of a second conductivity type electrically coupled to each other; and
  a pull-down network comprising a first transistor of the first conductivity type and at least one second transistor of the second conductivity type electrically coupled to each other, and wherein, for a last cascading sub-circuit of the plurality of cascading sub-circuits, the pull-up network is defined by the first pull-up network, and the pull-down network is defined by the first pull-down network.

16. The circuit arrangement as claimed in claim 15, wherein, for the each cascading sub-circuit, the cascading sub-circuit further comprises:

an auxiliary pull-up network electrically coupled to the pull-down network, the auxiliary pull-up network comprising at least one first auxiliary transistor of the first conductivity type; and an auxiliary pull-down network electrically coupled to the pull-up network, the auxiliary pull-down network comprising at least one second auxiliary transistor of the second conductivity type.

17. The circuit arrangement as claimed in claim 16, wherein, for the last cascading sub-circuit,
  the auxiliary pull-up network is further electrically coupled to the second pull-up network, and
  the auxiliary pull-down network is further electrically coupled to the second pull-down network.

18. The circuit arrangement as claimed in claim 1, wherein, for each of the first transistor of the second pull-up network and the second transistor of the second pull-down network, the transistor is configured to drive a load associated with the transistor, and wherein the first transistor of the second pull-up network or the second transistor of the second pull-down network has an aspect ratio that is sized larger than an aspect ratio of a transistor that is optimized for driving the load.

19. A method for forming a circuit arrangement comprising:

electrically coupling a first pull-up network of a first circuit and a second pull-down network of a second circuit to each other, and electrically coupling a first pull-down network of the first circuit and a second pull-up network of the second circuit to each other, wherein the first circuit is configured to receive one or more input signals provided to the circuit arrangement, wherein the second circuit is configured to provide one or more output signals of the circuit arrangement, wherein the first pull-up network comprises at least one first transistor of a first conductivity type and a second transistor of a second conductivity type electrically coupled to each other, wherein the first pull-down network comprises a first transistor of the first conductivity type and at least one second transistor of the second conductivity type electrically coupled to each other, wherein the second pull-up network comprises a first transistor of the first conductivity type, wherein the second pull-down network comprises a second transistor of the second conductivity type, wherein electrically coupling the first pull-up network and the second pull-down network comprises electrically coupling the first pull-up network and the second pull-down network to each other for the second transistor of the first pull-up network to drive the second pull-down network, and wherein electrically coupling the first pull-down network and the second pull-up network comprises electrically coupling the first pull-down network and the second pull-up network to each other for the first transistor of the first pull-down network to drive the second pull-up network.

20. A circuit arrangement for mitigating an effect of at least one transient voltage pulse generated in the circuit arrangement, the circuit arrangement comprising:

a first circuit and a second circuit, wherein the first circuit comprises:
  a pull-up network comprising a first pair of transistors of opposite conductivity types electrically coupled to each other; and
  a pull-down network comprising a second pair of transistors of opposite conductivity types electrically coupled to each other,
  wherein the pull-up network and the pull-down network of the first circuit are configured to receive one or more input signals, and further configured, in response to the one or more input signals received, for controlling the second circuit to provide one or more output signals, wherein the second circuit comprises:
  a pull-up network; and
  a pull-down network, and wherein, for controlling the second circuit to provide the one or more output signals,
  the pull-up network of the first circuit is electrically coupled to the pull-down network of the second circuit to drive the pull-down network of the second circuit; and
  the pull-down network of the first circuit is electrically coupled to the pull-up network of the second circuit to drive the pull-up network of the second circuit.

* * * * *